(12) United States Patent
Kunze et al.

(10) Patent No.: US 7,939,994 B2
(45) Date of Patent: May 10, 2011

(54) MICROMECHANICAL ACTUATORS COMPRISING SEMICONDUCTORS ON A GROUP III NITRIDE BASIS

(75) Inventors: Mike Kunze, Pfaffenhoffen (DE); Ingo Daumiller, Dietenheim (DE)

(73) Assignee: Microgan GmbH, Ulm (DE)

( * ) Notice: Subject to any disclaimer, the term of this patent is extended or adjusted under 35 U.S.C. 154(b) by 222 days.

(21) Appl. No.: 12/300,831

(22) PCT Filed: May 16, 2007

(86) PCT No.: PCT/EP2007/004394
§ 371 (c)(1),
(2), (4) Date: Jan. 26, 2009

(87) PCT Pub. No.: WO2007/131796
PCT Pub. Date: Nov. 22, 2007

(65) Prior Publication Data
US 2009/0174014 A1  Jul. 9, 2009

(30) Foreign Application Priority Data
May 17, 2006  (DE) .......................... 10 2006 022 940

(51) Int. Cl.
*H01L 41/053* (2006.01)
*H01L 41/047* (2006.01)
(52) U.S. Cl. .......................... 310/331; 310/349; 310/366
(58) Field of Classification Search .......... 310/330–332, 310/348, 349, 353, 354, 365, 366
See application file for complete search history.

(56) References Cited

U.S. PATENT DOCUMENTS

| | | | | |
|---|---|---|---|---|
| 5,162,691 A | * | 11/1992 | Mariani et al. | 310/321 |
| 5,631,463 A | * | 5/1997 | Kawasaki et al. | 850/59 |
| 6,362,542 B1 | * | 3/2002 | Novotny | 310/12.03 |
| 2002/0067992 A1 | | 6/2002 | Bridger et al. | |
| 2003/0119220 A1 | | 6/2003 | Mlcak et al. | |
| 2005/0099236 A1 | | 5/2005 | Kawakubo et al. | |
| 2005/0194867 A1 | | 9/2005 | Kawakubo et al. | |

(Continued)

FOREIGN PATENT DOCUMENTS

| | | |
|---|---|---|
| EP | 1617464 | 1/2006 |
| WO | 2004/083110 | 9/2004 |

OTHER PUBLICATIONS

Mills, "Nitrides in Europe", Nov. 2004, Elsevier Science Publishers, Oxford, III-Vs Review, The Advanced Semiconductor Magazine; vol. 17, No. 8; pp. 36-38.

(Continued)

*Primary Examiner* — Thomas M Dougherty
(74) *Attorney, Agent, or Firm* — Fay Kaplun & Marcin, LLP

(57) ABSTRACT

A semiconductor actuator includes a substrate base, a bending structure which is connected to the substrate base and can be deflected at least partially relative to the substrate base. The bending structure has semiconductor compounds on the basis of nitrides of main group III elements and at least two electrical supply contacts which impress an electrical current in or for applying an electrical voltage to the bending structure. At least two of the supply contacts are disposed at a spacing from each other respectively on the bending structure and/or integrated in the latter.

53 Claims, 19 Drawing Sheets

U.S. PATENT DOCUMENTS

| | | |
|---|---|---|
| 2005/0242687 A1 | 11/2005 | Kawakubo et al. |
| 2006/0055287 A1 | 3/2006 | Kawakubo et al. |
| 2006/0283255 A1* | 12/2006 | Tilak et al. ............. 73/705 |
| 2007/0024410 A1* | 2/2007 | Yazdi ............. 338/13 |
| 2007/0176211 A1* | 8/2007 | Kunze et al. ............. 257/232 |
| 2007/0228887 A1 | 10/2007 | Nishigaki et al. |

OTHER PUBLICATIONS

Davies et al., "Fabrication of GaN cantilevers on silicon substrates for microelectromechanical devices", Apr. 2004, American Institute of Physics, Melville, NY, Applied Physics Letters, vol. 84, No. 14, pp. 2566-2568.

* cited by examiner

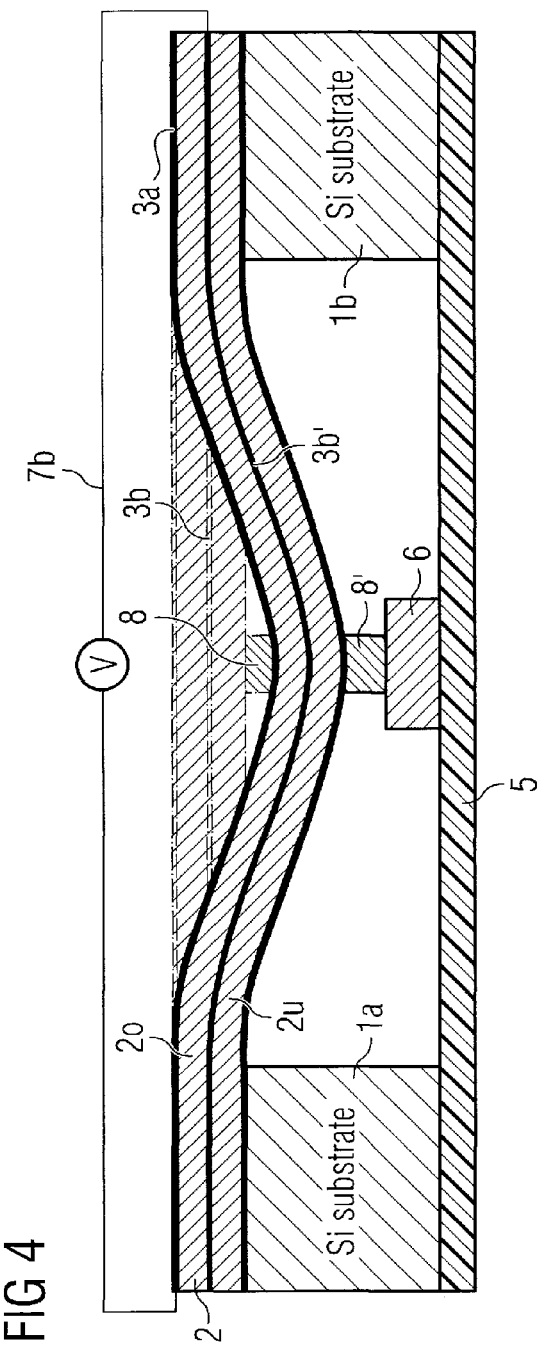
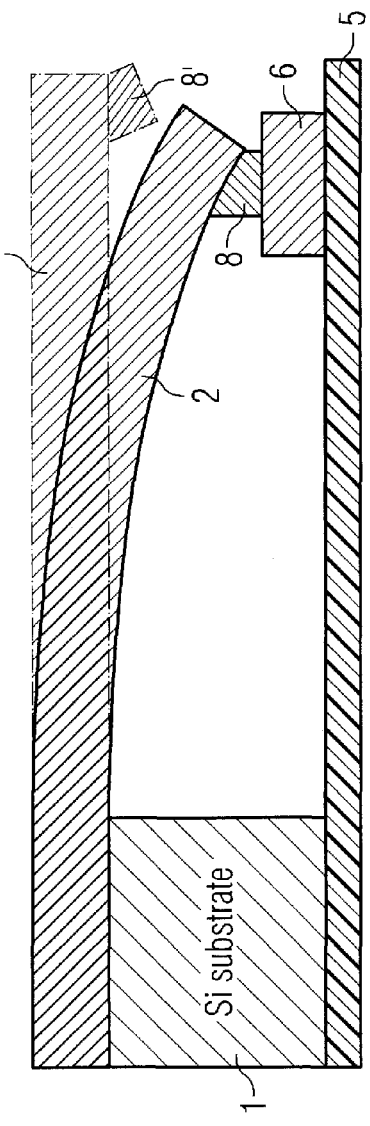
FIG 4
FIG 5

FIG 7A
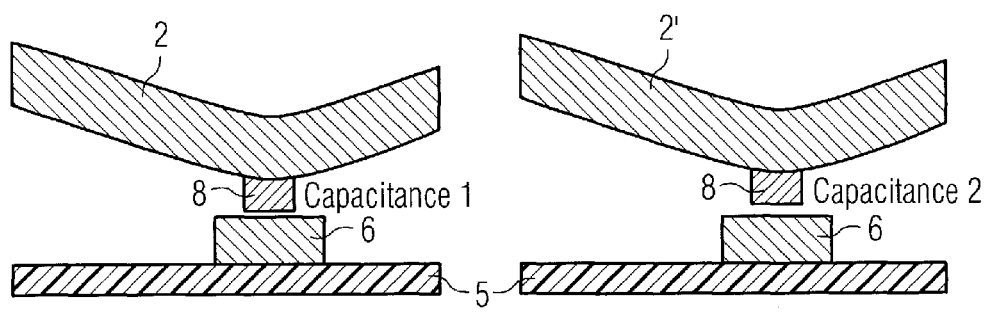
FIG 7B
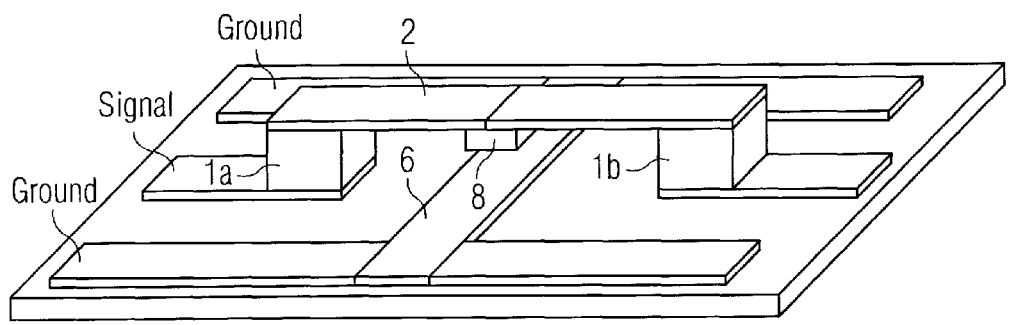
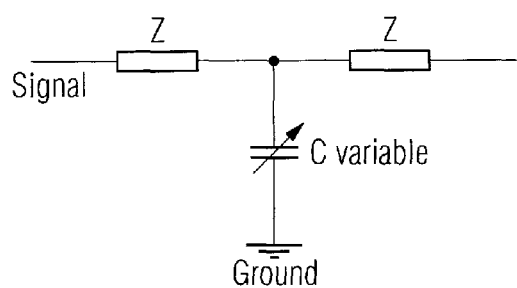

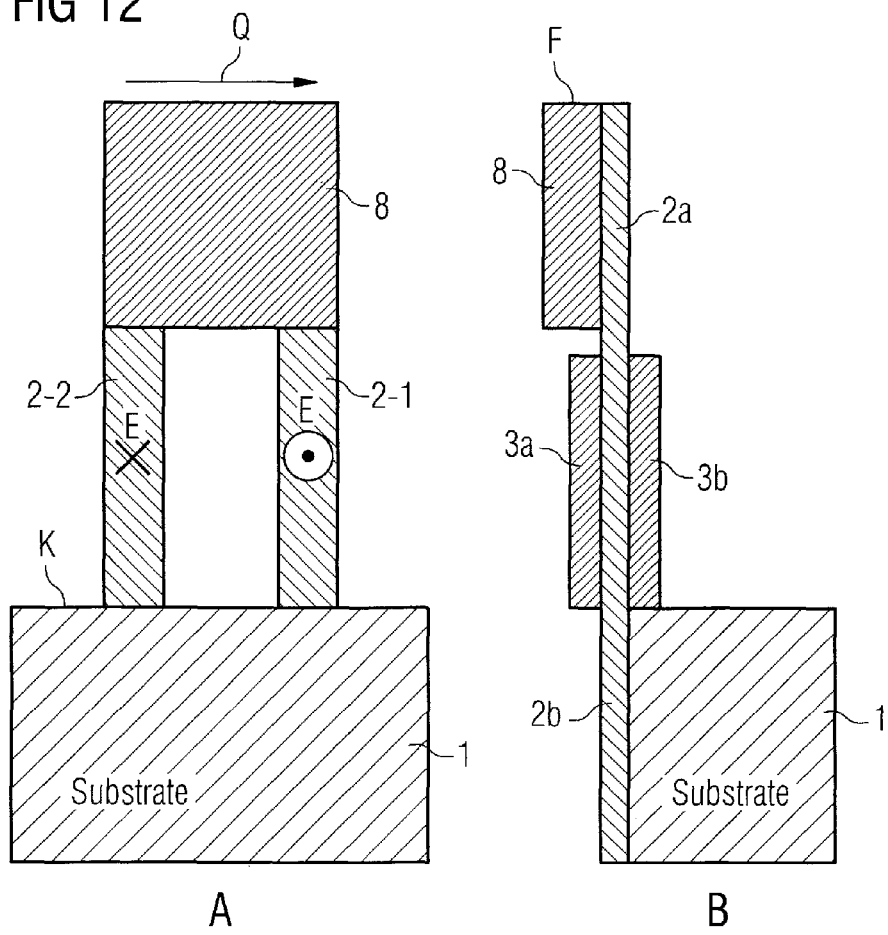
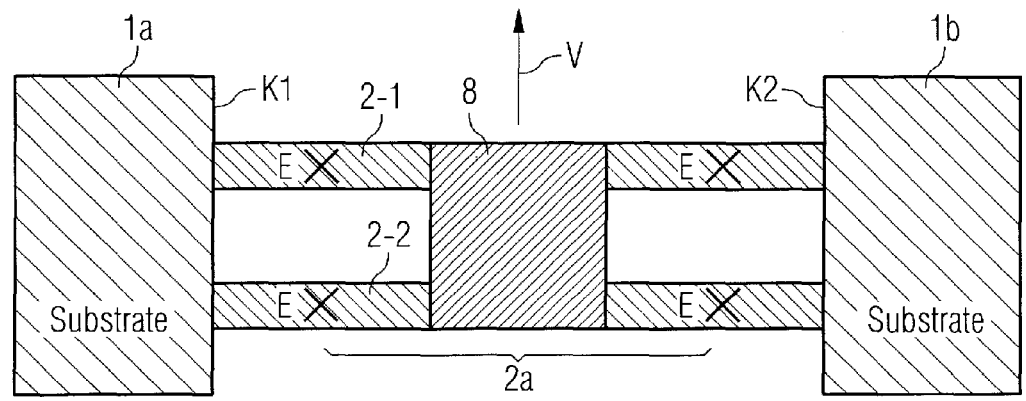

FIG 14
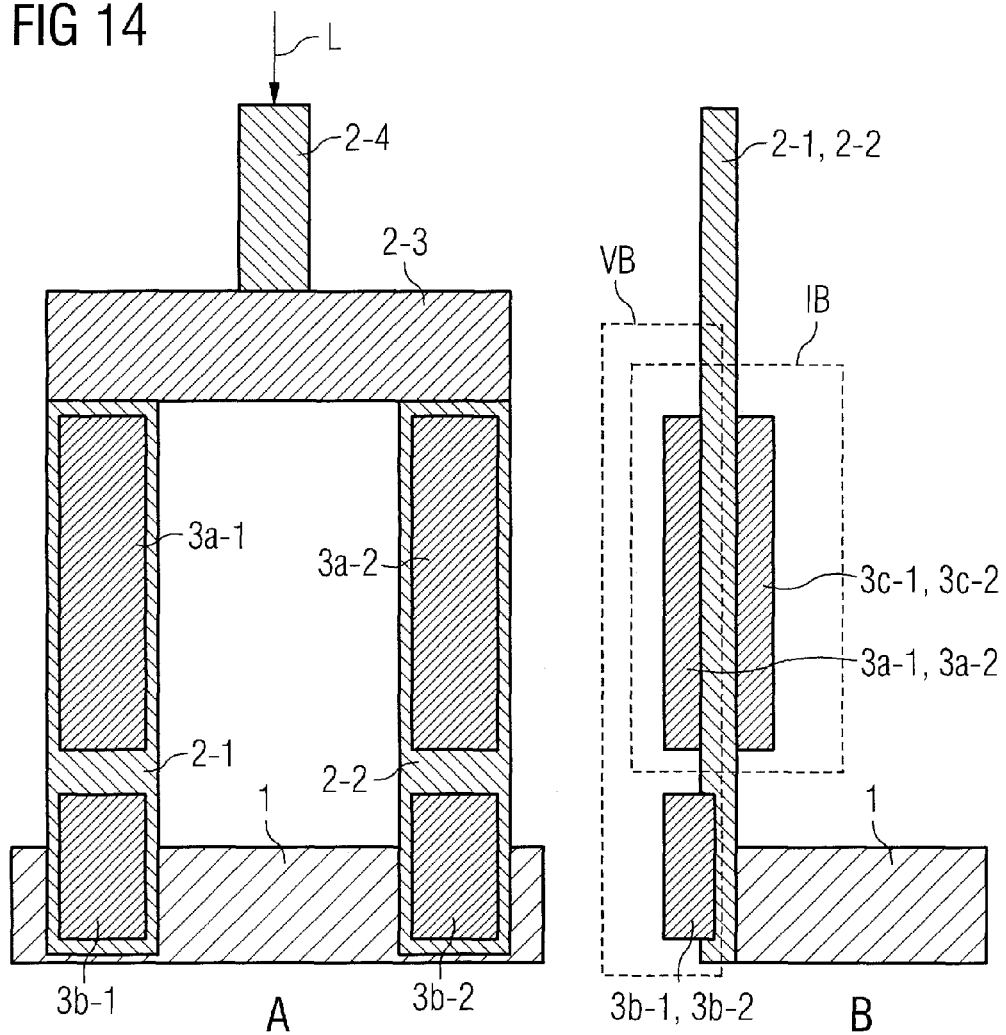
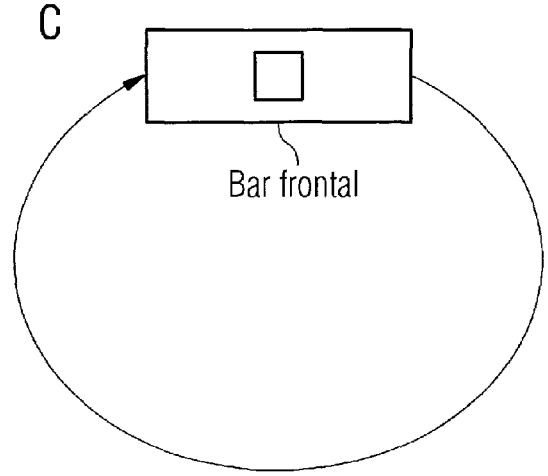

FIG 16
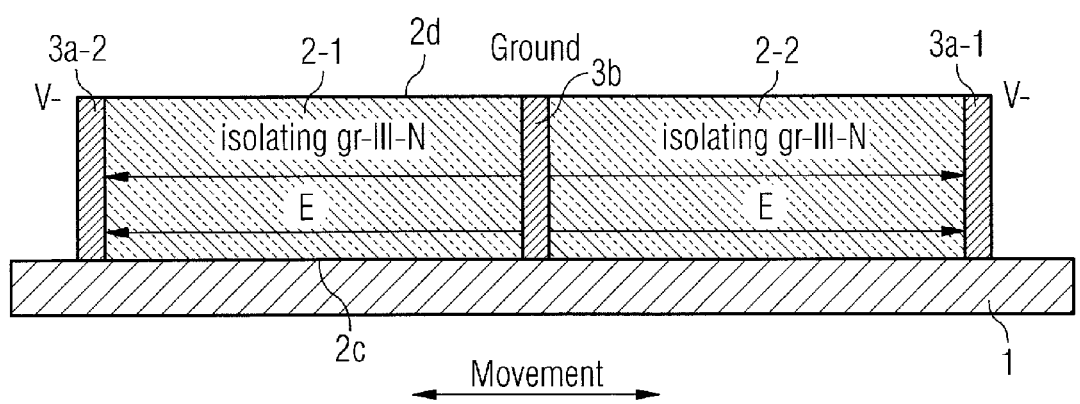
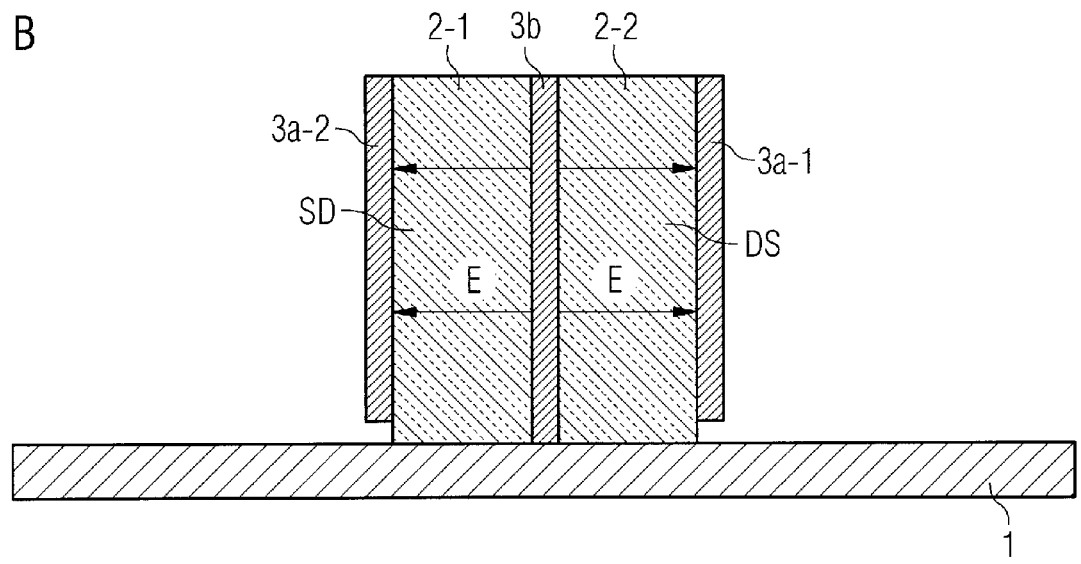

FIG 17
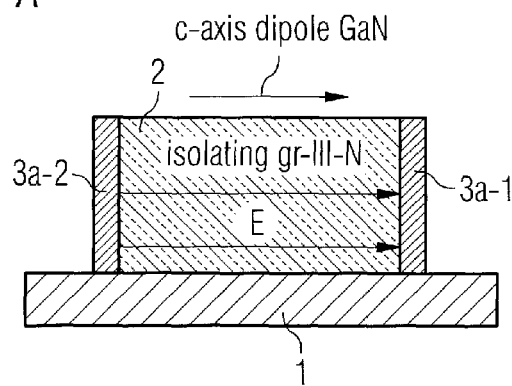
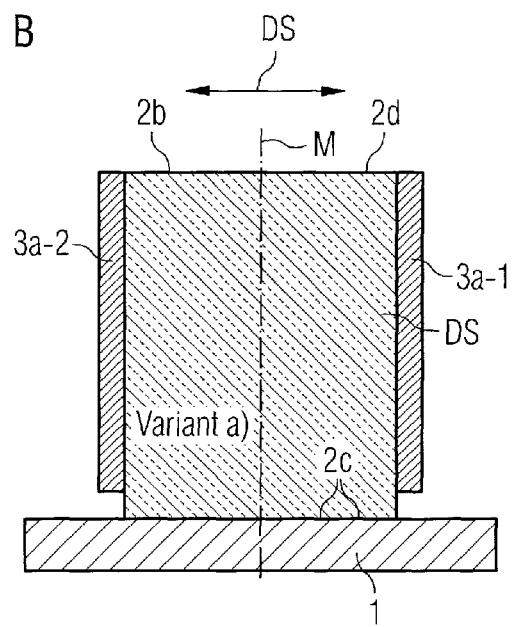 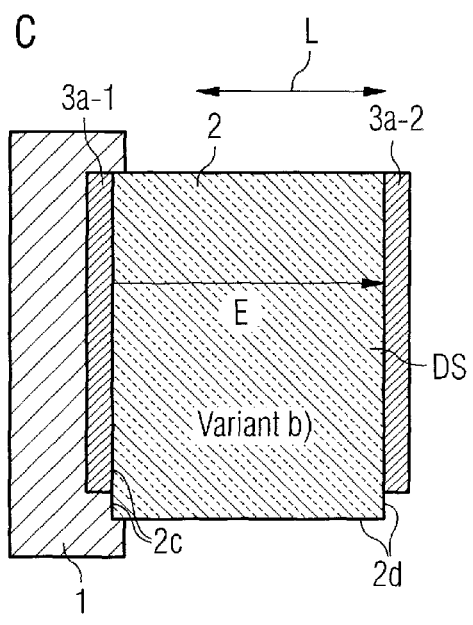

FIG 19
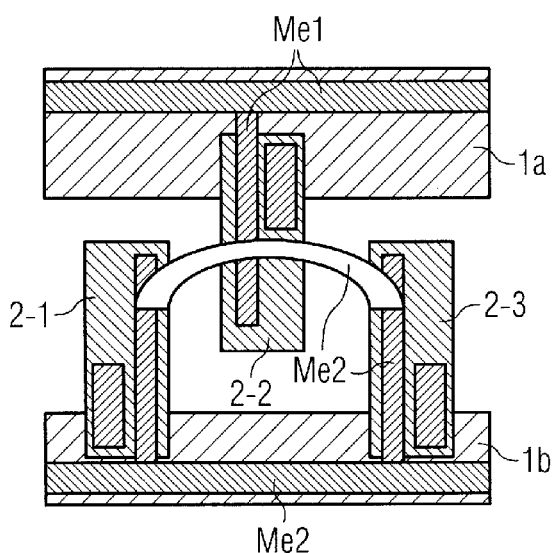
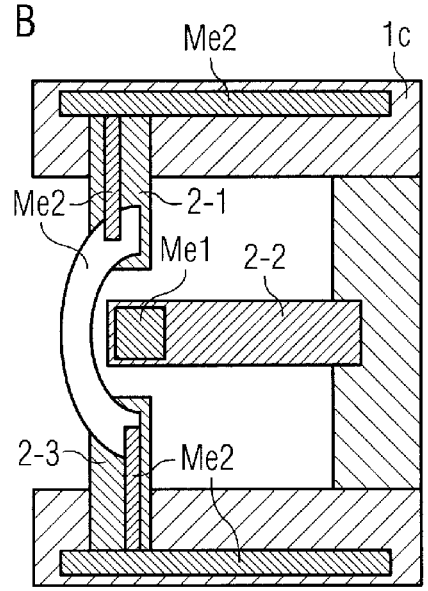
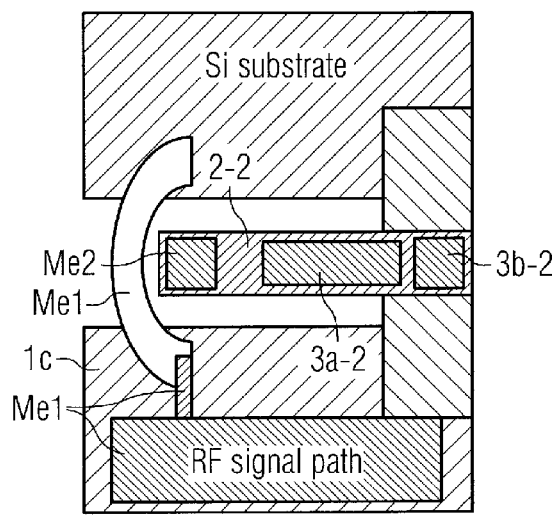

MICROMECHANICAL ACTUATORS COMPRISING SEMICONDUCTORS ON A GROUP III NITRIDE BASIS

SUMMARY OF INVENTION

The present invention relates to free-standing or cantilevered micromechanical components which can not only be structured in a simple manner by means of conventional methods but which are also distinguished, relative to the components known from the state of the art, by a simple construction, by a high input signal-deflection ratio and by variable possibilities for use (for example even at high temperatures).

The present invention describes actuators which have semiconductor structures on a group III nitride basis (for example made of GaN, AlN or InN). By applying a voltage to the semiconductor structure or by impressing a current in the semiconductor structure, the elements according to the invention, by means of the piezoelectric properties thereof, convert a change in the electrical input value into a change in another physical value, here movement.

The invention thereby relates in particular to micromechanical actuators, i.e. actuators which have or the individual components of which have a size in the range of a few 10 nm to several 100 μm, possibly even thereabove. The actuators according to the invention are hence MEMS components, the abbreviation MEMS stands for microelectromechanical systems. Here as in the following, the term group III or main group III is used as an abbreviation for the third main group of the periodic system of the elements. There is understood subsequently by the term of a homogeneous semiconductor layer, a layer which is constructed in the entire layer volume uniformly from a semiconductor material on a group III nitride basis. In contrast hereto, a semiconductor heterostructure has at least two homogeneous semiconductor layers which are disposed one upon the other or one against the other (for example AlGaN/GaN heterostructure: AlGaN layer on GaN layer). There is understood subsequently by a cantilevered element (e.g. cantilevered bar), an element which is connected in portions to a substrate base (anchor point or anchor points) and is not connected to the substrate in portions, but is disposed at a spacing from the substrate (for example at a spacing via a cavity between element and substrate). There is understood by a free-standing element, a cantilevered element (for example cantilevered bar) which has one (or possibly also several) anchors only at exactly one side or at one end and, at its opposite side or at the other end, has no anchor point, i.e. is therefore cantilevered in this region (for example a bar which is clamped on one side).

In comparison with standard materials in actuator technology, such as silicon, in the case of material systems which are produced on the basis of nitrides of main group III elements, there exist for the first time semiconductors which have strong polarity. Such structures are hence distinguished relative to conventional structures by pronounced piezoelectric properties which can be used in mechanical actuation. In order to impress the current or to apply the necessary voltage, in particular direct contactings can hereby be used at the interfaces of heterostructures (for example AlGaN/GaN), as is described subsequently in even more detail. A polarisation, which is equiaxed over the crystal and dependent upon the strain in the material or the high charge-carrier density on the surface of such a semiconductor structure and in particular also at the interface between two such semiconductor structures of a semiconductor heterostructure, is used according to the invention for example by means of direct contacting of the interface with an electrical contact as electrode. The (high) charge-carrier density at such a heterostructure interface is subsequently also termed 2D electron gas (2DEG). The use of the properties of a heterostructure or of the heterostructure interface (also termed heterostructure channel) is however not absolutely necessary for producing an actuator structure according to the invention. It has been shown that, even with homogeneous semiconductor layers (for example made of undoped or doped GaN), a sufficiently high input signal-deflection ratio can be achieved. Using merely one volume material (for example GaN) is hence likewise sufficient for actuator applications. The piezoelectric material properties can be used according to the invention for the purpose of producing structures which manage without a doping with foreign atoms in order to enable conductivity. However, likewise also the combination with a doping is possible (p- or n-doping for example of the volume material for better contacting). Since the piezoelectric properties of the material affect the free charge-carriers in the volume materials, manipulation of the piezoelectric properties by applying a voltage or by impressing a current in the materials in order to produce actuator components is used according to the invention. The components which are produced on machinable substrates are according to the invention advantageously detached partially or completely from the substrate (cantilevered or free-standing structures).

By means of electrical excitation of free-standing and cantilevered bending structures on the basis of semiconductor compounds of main group III elements (for example free-standing bars), because of the piezoelectric properties of the materials which are used, deflection of these bending structures is hence effected, which enables according to the invention for example the production of micromechanical switches or even varactors. Such switches or varactors can be used then in particular in high frequency MEMS technology (for example in telecommunications).

The essential basis for the production of semiconductor actuators according to the invention is represented by good technological machinability of the substrate material which is used. For this reason, advantageously silicon materials are used in the present invention as substrate base. The production of the MEMS which contain the semiconductor compounds on the basis of nitrides of main group III elements is effected on a silicon substrate, as described subsequently even more precisely, by means of structuring and processing of an epitaxially produced wafer (for example CVD method or PVD method). Differently from the standard production of MEMS components, with the MEMS components according to the invention no build-up or no structuring of the cantilevered or free-standing structures takes place with the help of foreign materials. If for example structures in the state of the art are produced with the help of dielectric layers and galvanised metals, then in the case of the MEMS technology according to the invention, the semiconductor material itself is the actuator in the MEMS component.

The present invention is now described subsequently, firstly in general; a plurality of individual embodiments follows for concrete technical production. Individual features according to the invention can hereby occur however not only in a combination as shown in the special advantageous embodiments, but they can also be configured and/or used in any other combinations within the scope of the present invention.

MEMS components according to the invention with semiconductor compounds on the basis of nitrides of main group III elements have, relative to the components known from the state of the art, the following advantages:

The pronounced polarisation properties of the semiconductor materials which are used enable a high input signal-deflection ratio and hence contribute substantially to the function of the actuators according to the invention. Furthermore, a high temperature stability is produced from the large band gap of the semiconductor materials, which enables the use at increased operating temperatures.

In combination with the polar properties of the semiconductor material on the basis of nitrides of main group III elements (subsequently now termed alternatively and in brief also Ga/Al/In nitride), the further properties of the material allow operation of the components even at high usage voltages or at high electrical power losses.

Because of the piezoelectric properties of the material, a linear deflection of the Ga/Al/In nitride-based micromechanical elements is possible as a function of an external electrical excitation. Consequently, the possibility is provided of producing a variable capacitance (varactor) with a very large $C_{min}/C_{max}$ ratio. A variation in the electrical characteristic values (capacitance) over the entire possible deflection stroke of the actuator can be reproducibly adjusted.

In comparison with conventional technologies, the Ga/Al/In nitride-based elements according to the invention have a greater power density, higher permitted operating voltages or operating currents and also increased permitted operating temperatures.

MEMS components according to the invention, relative to those of conventional technology, are distinguished in particular by the following properties: a small insertion loss, high insulation, their linearity, a large frequency band width, a small component size, small parasitic currents, rapid switching times, very high current and voltage carrying capacity, high direct current and high voltage-power pick-up and power loadability, high temperature- and long-term stability, their suitability for high ambient temperatures, a large deflection path or a large stroke of the switch, a very high $C_{min}/C_{max}$ ratio (in the case of a varactor) and high piezopolarisation of the material.

The present invention is now described in more detail with reference to a series of embodiments (FIGS. 1 to 20).

BRIEF DESCRIPTION OF DRAWINGS

FIG. 4 shows a further variant of an electrostatically deflectable switch in the form of a double-clamped freestanding bar of an AlGan/GaN heterostructure as in FIG. 3.

FIG. 5 now shows a further variant of a free-standing bar structure which is configured basically like the variant shown in FIG. 1

FIGS. 7A, 7B, 7C and 7D show how varactors (variable capacitances) can be produced with help of the semiconductor actuators according to exemplary embodiments of the invention instead of switch contacts.

FIGS. 12A-12B show a further exemplary embodiment according to the present invention for producing a semiconductor actuator which enables a transverse deflection.

FIG. 13 shows a further exemplary embodiment according to the present invention of a double bar.

FIG. 14 shows a further exemplary embodiment of a semiconductor actuator according to the present invention:

FIG. 16 shows a symmetrical construction which is based on the construction shown in FIG. 15.

FIGS. 17A, 17B and 17C show further exemplary embodiments of the present invention of a variant which is constructed basically similarly to the variants shown in FIGS. 15 and 16.

FIGS. 19A, 19B and 19C shows how, according to an exemplary embodiment of the present invention, an electrical useful signal can be guided during the deflection of the bars as shown in FIG. 18, FIGS. 20A, 20B and 20C show further exemplary embodiments in which the semiconductor actuator according to the invention is configured as a micromechanical membrane pump in which a membrane is raised and lowered.

DETAILED DESCRIPTION

Figure 1:
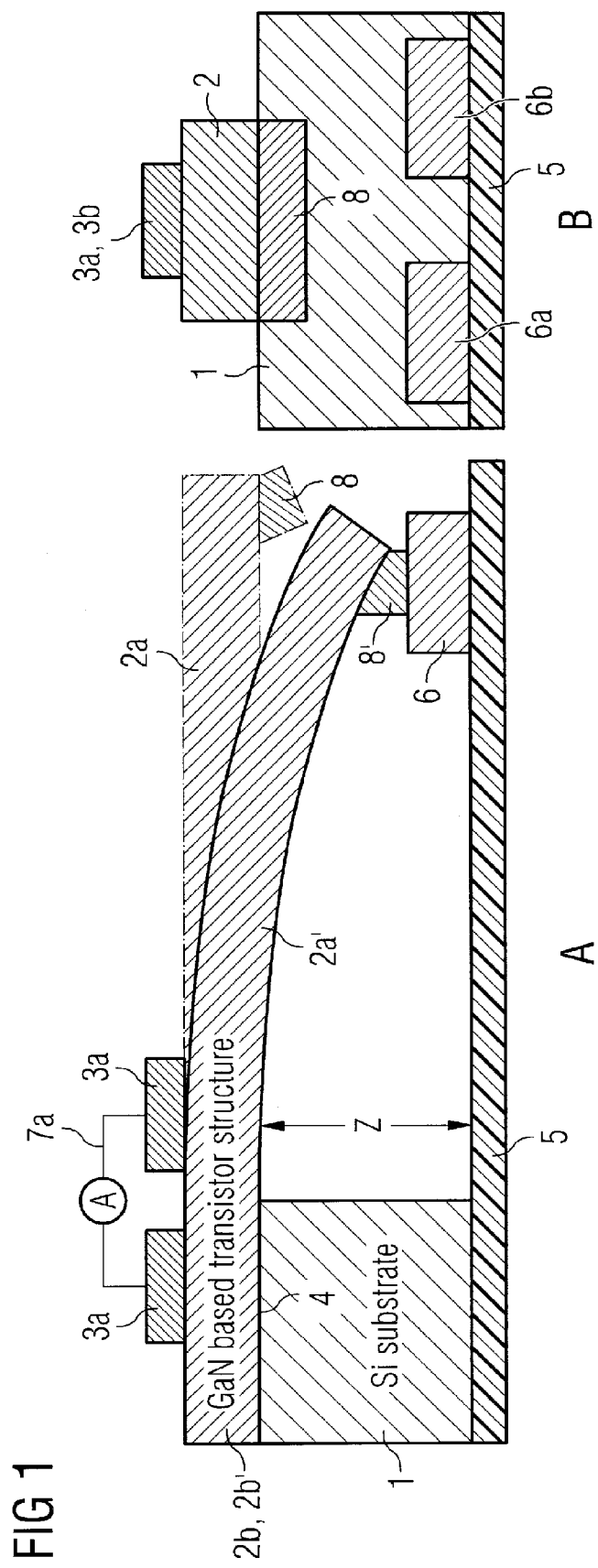
FIG. 1 shows an exemplary embodiment of an electrothermal semiconductor actuator according to the present invention in the form of a switch in a schematic representation.

FIG. 1 shows an electrothermal semiconductor actuator according to the invention in the form of a switch in a schematic representation (FIG. 1A: side view in section along the bar longitudinal direction, FIG. 1B: front view perpendicular thereto as projection view; both views viewed in the plane of the circuit board). A silicon substrate 1, shown here simplified in the form of a cuboid, is applied on the circuit board 5 in portions on one side. On the side situated opposite the silicon substrate 1, an electrical contact in the form of a waveguide 6 is disposed on a circuit board at a spacing from the silicon substrate 1. On the side which is orientated away from the circuit board, the silicon substrate 1 carries a bending structure 2 in the form of an extended bar. This extended bar, in the longitudinal direction, has a larger extension than the silicon substrate so that the bar 2 is disposed in portions (portion 2*b*, 2*b*') above the silicon substrate 1 or is connected via an anchor point 4 to the latter. The portion 2*a*, 2*a*' of the bar 2 which projects laterally beyond the silicon substrate 1 is hence free-standing because of the gap Z between bar 2 and circuit board 5 (merely one anchor point on one bar side connects the bar to the silicon substrate 1). At the end of the bar 2 which is situated opposite the silicon substrate 1, the latter carries an electrically conductive metal stamp (contact stamp 8) on its underside which is orientated towards the circuit board 5. The free-standing end of the bar 2 terminates above the waveguide 6 so that, in the inoperative position described subsequently in more detail, the contact stamp 8 is disposed above the waveguide 6 and at a spacing from the latter.

On the side which is orientated away from the silicon substrate (upper side), two electrical supply contacts 3*a* and 3*b* are disposed on the bar 2 adjacently at a spacing laterally. The first supply contact 3*a* is hereby disposed above the silicon substrate on the bar, i.e. in portion 2*b*. The second electrical supply contact 3*b* is disposed above the free-standing portion 2*a* of the bar 2 on the latter. The two electrical supply contacts are connected to each other via a current source 7*a*. As now described subsequently in more detail, the bar 2 in the inoperative state (i.e. in the state in which no current is impressed in the bar via the current source 7*a* and the contacts 3*a*, 3*b*) is not deflected, i.e. the portion 2*a* forms the portion of a straight line and extends at a constant spacing relative to the circuit board 5. When impressing a current via the source 7*a* in the bar 2, the latter bends, as described subsequently in more detail, through (position 2*a*'), i.e. the free-standing end of the bar which is orientated away from the silicon substrate 1 approaches the waveguide 6 which is disposed below this end with an increasing current flow so that, with sufficient current strength (position 8'), the contact stamp 8 closes the electrical contact between the two waveguide portions 6*a* and 6*b* and hence enables a current flow through the waveguide. The portion 2*b* thereby remains almost unaltered in its initial position (position 2*b*').

Hence FIG. 1 shows a first embodiment of a Ga/Al/In nitride-based switch.

A Ga/Al/In nitride-based transistor structure 2 (an AlGaN/GaN heterostructure with a standard transistor layer structure is usually used here) is grown epitaxially on a silicon substrate 1. Silicon substrate has the advantage that it can be machined by a dry-chemical etching method and it makes possible freestanding Ga/Al/In nitride-based films. With the help of Ga/Al/In nitride-typical technology processes, resistance elements or supply contacts 3 are now produced and, by means of a silicon rear-side process (see FIGS. 10 and 11), ultimately the free-standing bars 2*a*, 2*b* are produced. In order to make these bar structures usable for switching purposes, the contact stamp 8 is still required at the end of the free-standing bar. The contact stamp comprises a sandwich of a highly conductive layer (metal) and an insulation layer which is in communication with the Ga/Al/In nitride-based transistor structure.

For the final function, the bar structure 2 is placed (bonded or soldered) on a strip conductor or circuit board 5 on which the waveguide 6 or alternatively a contact strip is located. With the help of this switch, the waveguide or the contact strip can now be short-circuited or opened.

The resistance elements 3 of the Ga/Al/In nitride-based switch are hereby placed at the point with the greatest strain, i.e. at the substrate edge (i.e. one contact in the region 2*b*, one in the region 2*a*) and thereby act as piezoelectric resistors. In the inoperative state, this means that no potential is applied between the resistors or no current 7*a* is impressed in the resistors, the bar is straight and symbolises here the OFF state. This means: the connection in the waveguide 6 or in the contact strip is interrupted. If now a current is impressed in the piezoelectric resistance elements, then the strain in the material changes because of the local thermal change (on the upper side in the bar 2, a warmer region in the bar relative to the underside is formed) and the bar is deflected downwards at the free-standing end. The bar moves to the ON state and, with the contact stamp, closes the connection to the waveguide or to the contact strip.

The crucial advantage for use of such electrothermal Ga/Al/In nitride-based switches resides in the simplicity of the design. With the basis of a Ga/Al/In nitride-based transistor structure on silicon substrate, whether an HEMT structure (High Electron Mobility Transistor) or a volume-doped variant (MESFET, Metal Semiconductor Field Effect Transistor), all the components which are necessary to produce an electrothermal actuator are already implemented.

The polar nature of the Ga/Al/In nitride-based material system makes it possible to produce piezoelectric resistors. By using a structurable substrate material, the production of Ga/Al/In nitride-based bar structures is possible without external materials and without additional process steps.

The switching behaviour of the illustrated electrothermal Ga/Al/In nitride-based switch is dependent upon the thermal coefficient of expansion, the geometry, the modulus of elasticity and the thermal conductivity of the bar and also upon the power loss which is provided by the impressed current and the resistance of the piezoelement 2.

Figure 2:
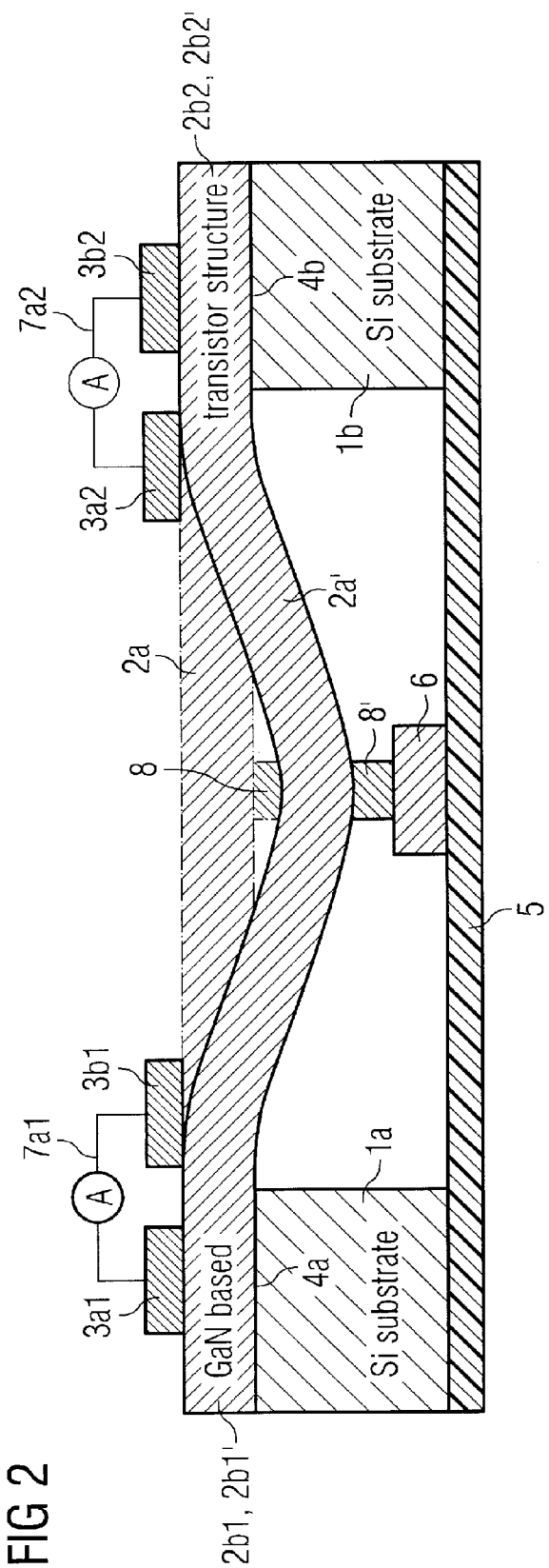
FIG. 2 shows, in side view, a schematic representation of an electro-thermally deflectable Ga/Al/In nitride-based switch in an exemplary embodiment of the present invention with a bar which is double-clamped.

FIG. 2 now shows, in side view, the schematic representation of an electrothermally deflectable Ga/Al/In nitride-based switch in an embodiment with a bar which is double-clamped (cantilevered, but no longer free-standing). As the Figure shows, this switch is constructed like two structures according to FIG. 1 which are situated opposite each other in mirror image in a plane perpendicular to the circuit board 5 at the level of the contact stamp 8. As a result, a bar 2 is produced which is situated on two silicon substrate portions 1*a* or 1*b* (not cantilevered portions 2*b*1 and 2*b*2 of the bar) at two anchor points 4*a* and 4*b* and has a cantilevered portion 2*a* therebetween. By means of a corresponding current flow 7*a*1 and 7*a*2, this bar can be bent towards the circuit board in the centre (where it carries the contact stamp 8 on the underside thereof), as a result of which (position 8') the contact to the waveguide 6 is closed in turn.

The advantage of this illustrated construction variant is increased mechanical stability of the now no longer free-standing but still only cantilevered bar (clamping of the bar at both oppositely situated ends). The technological complexity for producing this variant changes only insubstantially in comparison with the variant shown for producing that in FIG. 1.

Figure 3:
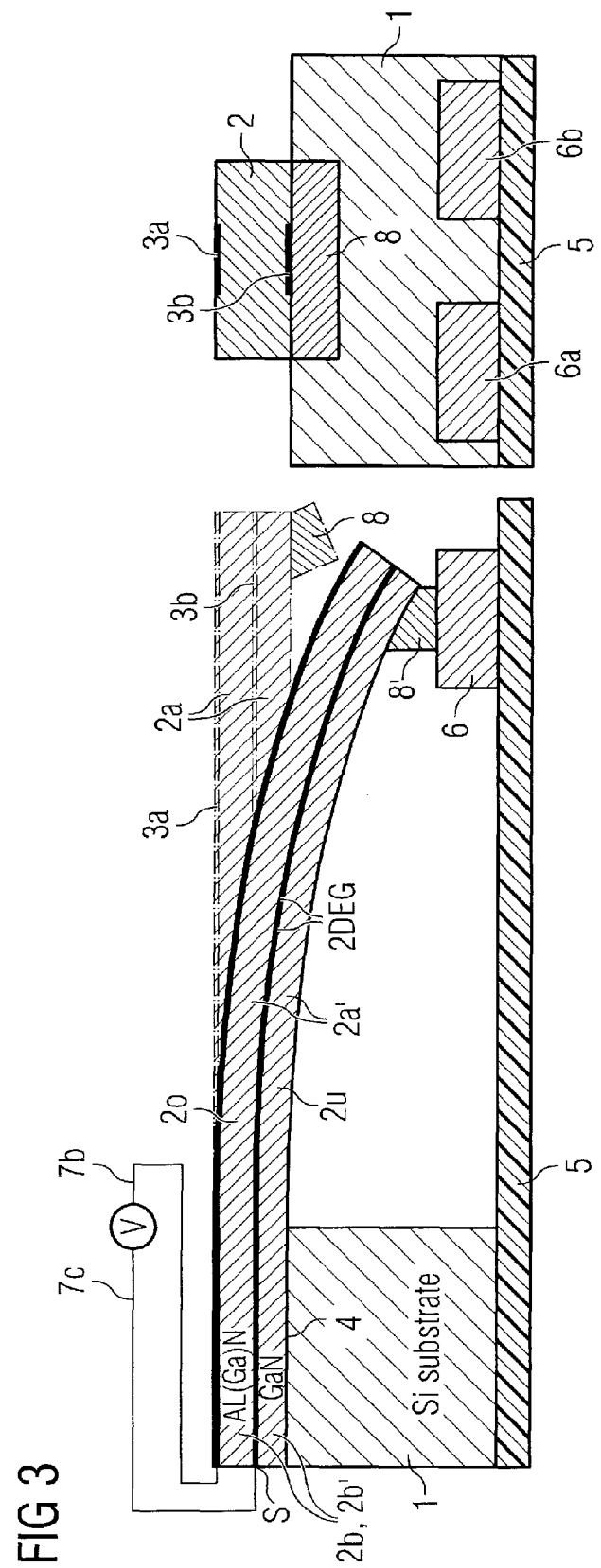
FIG. 3 shows another exemplary embodiment according to the present invention of an electrostatically deflect-able switch on the basis of an AlGaN/GaN hetero structure.

FIG. 3 shows the schematic representation (analogously to the views in FIG. 1; FIG. 3A: side view, FIG. 3B: front view) of an electrostatically deflectable switch on the basis of an AlGaN/GaN heterostructure. The basic structure of the illustrated switch is like that of the switch shown in FIG. 1 so that, in the following, only the differences are described. The free-standing bar structure 2 is configured here as a two-layer AlGaN/GaN heterostructure: on a first GaN layer 2*u* which is orientated towards the circuit board 5 or the silicon substrate 1, a second layer 2*o* made of AlGaN is disposed. As described subsequently in more detail, the essential aspect in this variant is that the high charge-carrier density (2D electron gas)

2DEG at the heterostructure interface between these two layers 2o and 2u (or in the heterostructure channel) is used directly, i.e. without introducing an additional conductor layer, doped layer or similar, as an electrical supply contact or as an electrode 3b. On the upper side of the top AlGaN layer 2o, a metal layer is then applied partially or over the entire surface as a second electrode or second electrical supply contact 3a. The top AlGaN layer 2o is hence situated in the manner of a sandwich between the two surface electrodes 3a and 3b. On the narrow side or front end S of the heterostructure interface 3b, the latter is connected directly via a metallic contact (line 7c) to a voltage supplier 7b. This voltage supplier connects the two electrodes 3a and 3b and thus enables application of an electrical field in the region of the AlGaN cover layer.

In particular the strong polarisation effects in Ga/Al/In nitride-based heterostructures lead hence to the second variant of the Ga/Al/In nitride-based switches. The basic principle is the same as the one shown in FIG. 1. A bar structure 2 clamped on one side acts as switch which can bridge (ON state) or interrupt (OFF state) a waveguide 6 or a contact strip with the help of a contact stamp 8. The technology and the operation of the Ga/Al/In nitride-based high frequency or RF switch represented in FIG. 3 differs however significantly from the electrothermally deflected variant of FIG. 1.

The basis of this is the deflection of free-standing piezo-electric structures by means of electrostatic fields. In principle, a piezoelectric material is thereby situated between two metal plates. Due to the inverse piezoelectric effect, the result is distortion and deformation of the piezoelectric material if an electrical voltage is applied to the electrodes.

By means of processes known to the person skilled in the art (epitaxy on a wafer or carrier substrate preferably made of Si), a free-standing bar with a layer 2u and a layer 2o disposed thereon and made of a piezoelectric material is produced. During the processing of the bar, the two electrodes 3a and 3b are produced. The contact which contacts the 2DEG is thereby produced preferably by alloying so that a conductive connection of the metal electrode to the 2DEG is constructed. By applying an electrical voltage, the piezoelectric layer 2o is deformed and the bar is deflected.

The illustrated Ga/Al/In nitride-based heterostructures, in which strong piezoelectric fields occur, hence make it possible to produce free-standing bars or actuators in which the piezoelectric component is already integrated. Starting from a possibly already pre-strained (see FIGS. 5 and 6) Ga/Al/In nitride-based heterostructure on a silicon substrate, a free-standing bar with a contact stamp is structured analogously to the electrothermal variant of FIG. 1. Generally, the heterostructure consists of an AlGaN/GaN layer system. In order however to achieve as large as possible a piezoelectric strain pure AlN/GaN layers are also conceivable or even the use of InGaN or InAlN layers in one heterostructure is conceivable. In combination with a Ga/Al/In nitride layer, the use of other layers made of a wide-band-gap material is also conceivable (in particular e.g. made of ZnO or diamond).

The piezoelectric active layer 2o is clamped here between two electrodes. The upper metal electrode thereby causes no problem in production. However it is not possible, because of the epitaxial growth of this layer sequence, to place an external electrode in this material system at the location of the electrode 3b. Therefore, according to the invention the high charge-carrier density (2DEG) at the heterostructure interface itself is used as electrode 3b.

It is hence an essential aspect here that no additional doped layer and/or metal layer or similar requires to be introduced into the structure 2 in order to serve as electrode 3b. Direct contacting (in the end-side region S) is possible with a conventional metallic contact without additional electrically conductive structures being required here. In a simple manner, the production of the above-described structure and the application of a voltage 7b to the piezoelectric layer 2o is hence possible. As in the variant shown in FIG. 1, the controlled current (useful signal) which flows via the contact closure of the elements 8 and 6 is completely separated from the control signal 7a or 7b.

A further essential aspect of this variant is the preferred use of a 111 silicon substrate. However, also a 100 silicon substrate or a 110 silicon substrate can be used. With suitable adaptation of the process or epitaxy technology, also a substrate other than the silicon used by way of example in FIG. 3—such as for instance sapphire or silicon carbide—can be used.

The mode of operation of this variant is described subsequently. For this purpose, firstly the term of spontaneous polarisation is defined (subsequently also termed Psp). There is understood here the polarisation of an unstrained crystal on the basis of the lattice structure (for example the hexagonal lattice structure). There is understood by piezoelectric polarisation (subsequently also termed Ppz) voltage-induced polarisation: during the growth of a crystal on a foreign substrate, the lattice constants do not match so that the epitaxial layer is strained (as long as it is substantially thinner than the underlying substrate). In the case of the 111 silicon which is normally used, the c-axis of the semiconductor compounds on the basis of nitrides of main group III elements now stands perpendicular to the surface, i.e. perpendicular to the interface between the substrate and a grown-on semiconductor structure. For example, the dipole of a GaN layer normally stands (for example in the production by means of metal organic chemical vapour phase epitaxy, MOCVD) such that the Ga side is at the top, i.e. is disposed on the side orientated away from the substrate (so-called "Ga face": on the side orientated towards the substrate, the N layer begins, the end of the grown-on semiconductor structure on the surface of the semiconductor, i.e. on the side orientated away from the substrate, is produced as Ga layer, the vector of the Psp is perpendicular to the substrate and points towards the substrate). This applies also for Ppz. However it is now also possible (for example by means of molecular beam epitaxy) to rotate the direction of the dipole by means of an altered growth start (so-called "N face": the Ga layer is obtained here on the side orientated towards the substrate, the upper end is then produced with the N layer). The vector of the Psp then stands always still perpendicular to the substrate or to the interface between substrate and grown-on semiconductor structure but the direction is directed away from the substrate (likewise in the case of Ppz). In the typical case of an electrostatic deflection of the actuator perpendicular to the substrate, the construction is chosen such that the c-axis of the crystal stands perpendicular to the substrate (example: AlGaN/GaN structure on a 111 silicon substrate). For an electrostatic deflection of the actuator in the plane of the substrate, the construction must however be modified: the aim now is to tilt the c-axis by 90°, i.e. to bring it in a direction parallel to the separation plane between the substrate and the grown-on semiconductor structure (cf. also FIG. 17A subsequently).

For this purpose, the growth of the crystal must be changed. For example, the growth can take place on a 100 Si substrate such that, as described above, a hexagonal lattice with a Ga face is formed. However the growth can also take place such that the crystal has a cubic lattice, here Psp becoming 0 (not Ppz). Hence an epitaxy on higher indexed growth planes (i.e. on tilted growth planes) can hence be effected, which ensure reduced polarisation (so-called semipolar facets). Hence according to the invention also a substrate with a different orientation (for instance 100 or 110 instead of 111 Si) can be used but, alternatively thereto, also a structured substrate can be used (the latter for example by etching or deposition of layers so that grooves or hills with inclined side flanks are produced at specific positions). This is effected in order to influence the piezopolarisation.

If a voltage 7b is now applied between the channel charge 2DEG at the heterostructure interface and the upper electrode 3a, the result is strain of the Ga/Al/In nitride-based heterostructure because of the inverse piezoelectric effect. The bar is deflected and can fulfill the switch function already described in FIG. 1.

There is a crucial advantage here also in the piezoelectric Ga/Al/In nitride-based actuators in the simplicity of the design. With the basis of a Ga/Al/In nitride-based heterostructure on a silicon substrate, all the components which are required to produce a piezoelectric actuator are already implemented in the layer structure. The high piezoelectric fields and the large charge-carrier densities in the Ga/Al/In nitride-based heterostructure allow a simple production of a piezoelectric actuator.

The switching behaviour of the piezoelectric Ga/Al/In nitride-based switches is dependent upon the piezoelectric constants, the modulus of elasticity, the bar geometry and the applied voltage.

FIG. 4 shows a further variant of an electrostatically deflectable switch in the form of a double-clamped free-standing bar of an AlGan/GaN heterostructure as in FIG. 3. The construction of the variant shown in FIG. 4 is similar to the basic construction of FIG. 2 and has the following differences (the further aspects are produced as in the case shown in FIG. 2): instead of the in total four supply contacts 3a1, 3b1, 3a2 and 3b2 of the case shown in FIG. 2, which are disposed on the surface of the bar structure, the bar structure which is clamped on both sides, as shown in FIG. 3, has two electrodes 3a (upper side of the bar structure, partial or full-surface metal electrode) and 3b (as in FIG. 3 configured as 2DEG electrode). The mode of operation when applying a voltage 7b between the two electrodes 3a and 3b with the semiconductor layer 2o made of AlGaN and inserted therebetween in the manner of a sandwich is therefore produced as in the case shown in FIG. 3. In the case of the illustrated heterostructure, hence there are used as electrodes, a metal layer on the surface (electrode 3a) and the 2DEG (electrode 3b) of the heterostructure. When applying the voltage, the lattice constant changes perpendicularly and horizontally relative to the bar due to the reverse piezoelectric effect so that a change in length in the upper bar portion 2o results. Since the lower region 2o is not changed, bending of the entire structure 2 results.

Such a mode of operation can also be reproduced in the case of a homogeneous semiconductor structure in that a doped layer is introduced instead of the 2DEG: such a variant, which is not shown here and which can be produced likewise as a bar which is clamped on one side or two sides, arises if an intermediate layer is produced on a lower (orientated towards the circuit board) first GaN layer by doping with silicon, on which intermediate layer a second GaN layer is then grown epitaxially further as upper side of the bar structure. The silicon-doped intermediate layer can then be used as second electrical supply contact 3b (e.g. with end-side contacting in region S), a partial or full-surface metallisation which is applied on the upper side of the second GaN layer then as first electrical supply contact.

There are hereby two possibilities of producing this conductive doped layer (for example the mentioned silicon-doped intermediate layer): either directly during the epitaxy (growth of the lower region 2u, growth of the doped layer which is then used as electrode 3b, then growth of the upper region 2o) or growth of an undoped homogeneous layer and implantation of a doping to the desired depth. The advantage in the first production is that implantation process steps can be dispensed with but the result can be blurred doping profiles due to entrainment of the doping atoms during growth of the upper layer, as a result of which undesired residual conductivities are produced in the upper layer. In the last-mentioned variant, the entire homogeneous layer can, during implantation, be "trimmed" to a high insulation (a very clean growth situation without doping materials is produced) and a region can be made conductive subsequently in a targeted manner.

FIG. 5 now shows a further variant of a free-standing bar structure which is configured basically like the variant shown in FIG. 1 but has the following differences: in all the previously shown variants, the OFF state of the switch (elements 6 and 8 not connected electrically conductively) is set by the inoperative position of the bar, i.e. that position in which no current is impressed or no voltage applied. Only by the effect of electrical variables are the switches shown in FIGS. 1 to 4 moved into the ON state.

In the Ga/Al/In nitride-based material system, the behaviour or the position of the free-standing bar in the inoperative position is dependent upon the straining of the epitaxially grown layer 2. According to whether the layer(s) are strained by tension or pressure or for instance are almost unstrained with the help of stress compensation layers, the inoperative position of the free-standing bar can be changed. Thus it is entirely possible that the inoperative position of the bar can also represent the ON state according to the growth conditions. This means that the bar is already deflected in its inoperative position 2. Only by applying electrical variables does a switch take place then from the ON state to the OFF state and the bar changes into a horizontal position 2'. The possibility arises therefrom, according to the field of use, of choosing the most favourable variant with respect to energy of the Ga/Al/In nitride-based switches. Hence the efficiency of the entire system can be further increased.

Figure 6A:
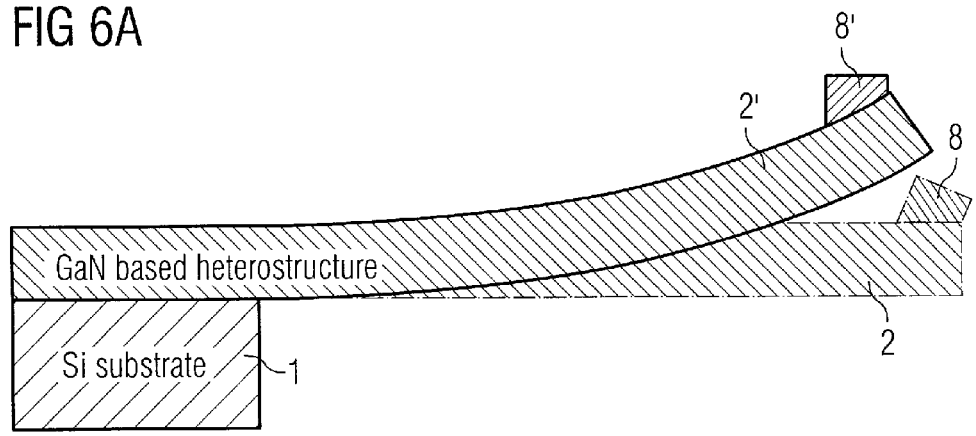
FIG. 6A shows a bar 2 located in an inoperative position in a horizontal position according to an exemplary embodiment of the present invention.
Figure 6B:
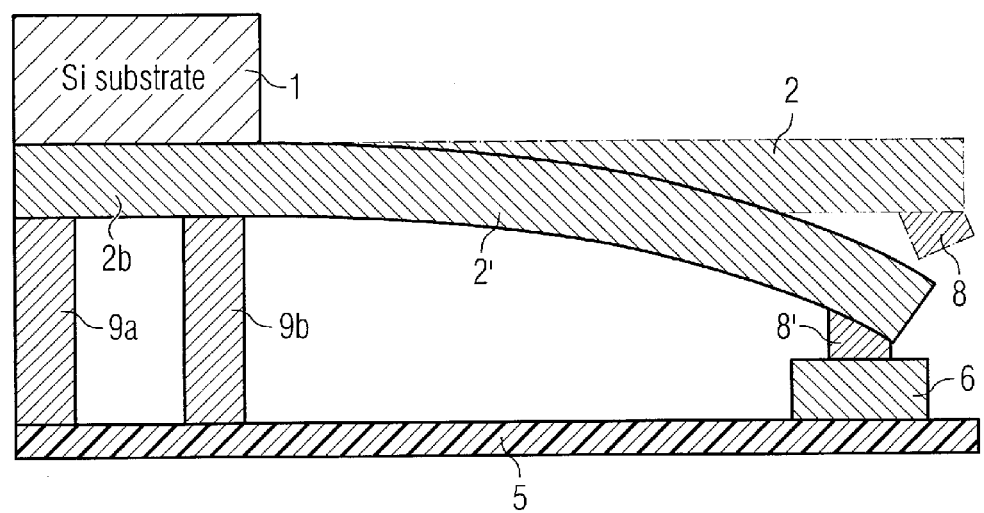
FIG. 6B shows a silicon substrate and a bending structure disposed in a reverse sequence with respect to a circuit board according to a further exemplary embodiment of the present invention.

Furthermore it is also possible (see FIG. 6) to produce bars 2 on the basis of the straining moments in the Ga/Al/In nitride-based material system, said bars being deflected upwards when the current or the voltage is applied. Upwards here means that the free-standing end is moved away from the substrate 1, viewed in the direction perpendicular to the plane of the circuit board 1. As also in FIG. 5, in FIGS. 6A and 6B, the electrical contacts 3 are no longer illustrated for the sake of simplicity. As FIG. 6A shows, the bar 2 is located in the inoperative position in a horizontal position. By means of suitably chosen pre-tension of the semiconductor materials or of the layers, bending of the bar upwards is effected when applying the electrical variables, i.e. here in the direction (position 2') pointing away from the silicon substrate 1. In order that a corresponding contact closure is possible, the contact element 8, 8' is for this reason placed on the upper side of the bar structure 2 which is orientated away from the substrate base 1. FIG. 6B shows a further case of this type: by means of the suitably chosen pretension, a simplified construction technique is possible here: silicon substrate 1 and bending structure 2 are disposed here in reverse sequence with respect to the circuit board 5. Between the upper side (viewed with respect to the substrate 1) of the bar structure 2 and of the circuit board 5, two bumps 9a and 9b are disposed in order to set a suitable spacing between bar structure 2 and circuit board 5 (in region 2*b*). In the inoperative position, the bar is located in the horizontal position 2; the contact stamp 8, as in FIG. 6A, is applied on the upper side thereof. When applying the electrical variable, deflection is effected upwards (viewed with respect to the substrate 1), as a result of which the spacing of the free end of the bar relative to the circuit board 5 is reduced and, by means of the contact stamp 8, the contact to the waveguide 6 is closed (position 8'). The bumps 9 are produced with the help of galvanic methods on the upper side of the circuit board or also on the semiconductor structure; by means thereof, the structure comprising bar 2 and substrate 1 can hence be bonded head first to a corresponding board or the circuit board.

FIG. 7 shows how varactors (variable capacitances) can be produced with the help of the semiconductor actuators according to the invention instead of switch contacts. The basic construction hereby corresponds to the construction of the switches as shown in FIGS. 1 to 6. In the production of varactors according to the invention, the change in capacitance of the component is effected by variation of the spacing of two metal elements (in the example: stamp 8 and waveguide or counter-element 6) relative to each other. FIG. 7A hereby shows the principle in a diagram in a construction with a bar clamped on two sides (only the essential elements are shown here). In the left picture, a larger deflection of the bar, clamped on two sides, is shown (position 2) than in the case illustrated on the right (position 2'). The spacing (viewed perpendicular to the plane of the circuit board 5) of the element 8 from the counter-element 6 is hence less, in the case shown on the left than in the case shown on the right (position 8' there). Because of the already described linearity, the deflection shown on the right (which corresponds to half the total deflection) leads to half the capacitance value as in the case shown on the left.

The technological construction of the Ga/Al/In nitride-based varactors is equivalent to those of a MEMS switch. However not only two operating states can be achieved with the varactor configuration (ON, OFF) but also all the intermediate steps. The bar can thereby change its position or deflection variably according to which impressed current or applied voltage is present. The more accurately the position or location of the bar can be adjusted, the more precise the adjustment possibility of the capacitance and hence for example variability of an adaptation network of a high frequency base station in which the individual adaptive switching blocks can be actuated by means of such varactors. Both the embodiment of the Ga/Al/In nitride-based switches as electrothermal variant and the piezoelectric variant are suitable for producing varactors since, in both cases, not only a discrete circuit is possible between two states but a variable control of the deflection by means of the external electrical variables.

According to in which signal path the varactors are used, they differ in their construction. Variable capacitors in a matching network can be connected both in parallel to the signal line (shunt C) and in series thereto. As a function of the use of the varactor in the matching network, differentiated properties are possible with respect to insulation behaviour and intrinsic losses. In a series circuit (FIG. 7B) the signal path leads over the Ga/Al/In nitride-based varactor component. This means that the varactor must have as low as possible intrinsic losses in order to cause no damping of the signal. In the case of a parallel circuit (FIG. 7C), high insulation of the varactor is required in order to produce no parasitic losses.

Figure 7C:
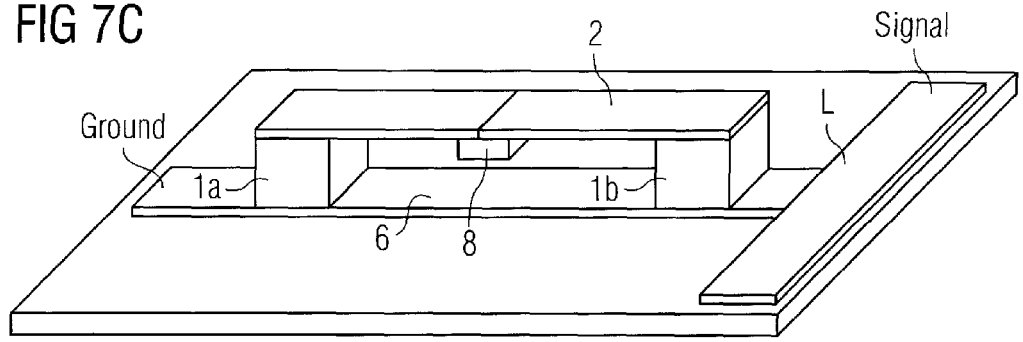

In the case shown in FIG. 7C of the parallel circuit of the varactor, the signal path hence does not lead over the Ga/Al/In nitride-based varactor component but over the line L on the circuit board.

The line portions 6 (corresponding to the counter-element 6) on the surface of the circuit board 5 are already closed in the structures shown in FIGS. 7B and 7C since here the contact stamp 8 does not experience direct contact with the elements 6 (as in the case of the above-described switch) but changes only its spacing above the elements 6. In the case shown in FIG. 7B, the capacitance C of the illustrated arrangement is produced from the capacitor which is formed between signal and ground by the element 8 (which is connected via the bar 2 to the line parts "termed" signal and has a surface A) and the element 6 (connection to ground):

$$C = e_0 \cdot e_r \cdot A/d$$

d being the spacing of elements 8 and 6. The capacitance of the line to earth is therefore varied with the spacing d. The variant shown on the left at the top in FIG. 7B (embodiment in coplanar technology) corresponds hence to a first approximation to the equivalent circuit diagram shown at the bottom on the right in FIG. 7B (Z is the characteristic wave impedance of the line).

Figure 7D:
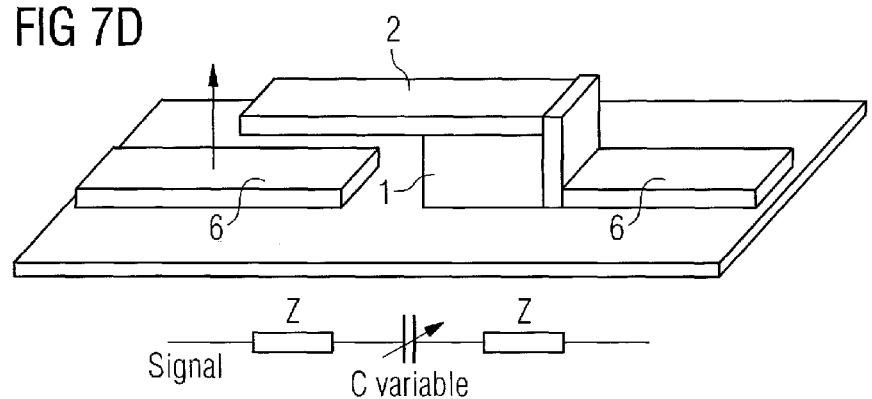

FIG. 7D shows a further variant in which a varactor with a variable capacitance is produced in series (equivalent circuit diagram FIG. 7D on the left, construction principle on the right; the contacts 3 for the bar deflection are not shown here). The variant of FIG. 7D which is produced again as a free-standing bar, clamped on one side, can, in one switch configuration according to FIG. 7B, likewise be used as in a switch configuration according to FIG. 7C. The switch configurations shown in FIGS. 7B and 7C can hence be produced in two embodiments (with the capacitance C parallel to earth or in series). Basically, the variant shown in FIG. 7B has the disadvantage that the useful signal must be guided over the bar (in the simplified diagrammatic representation, the conductor structures which are used for a useful signal are not all illustrated). This likewise applies in the case shown in FIG. 7B, as in the variant produced according to FIG. 7D with the bar clamped on one side. In the variant shown in FIG. 7C, this is not required (in both methods for producing the capacitance, i.e. with the capacitance parallel to earth or in series).

Figure 8:
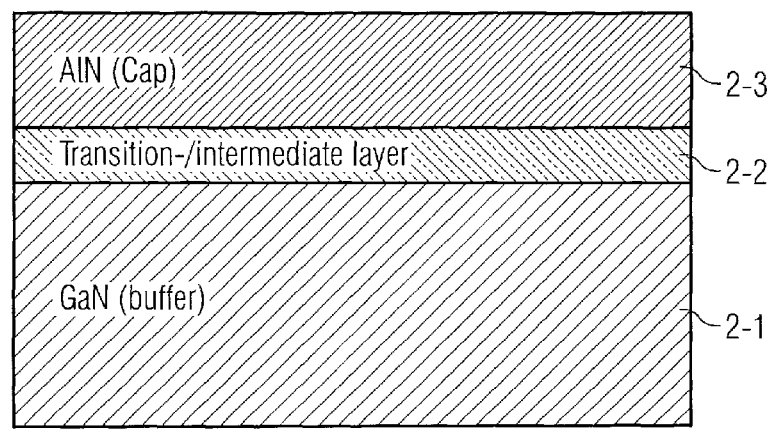
FIG. 8 shows, in side view, a semiconductor structure as can be used in a particularly preferred manner for the variants of the actuator according to exemplary embodiments of the present invention shown in FIG. 1 and FIG. 2.

FIG. 8 shows, in side view, a semiconductor structure as can be used in a particularly preferred manner for the variants of the actuator according to the invention shown in FIG. 1 and FIG. 2. The bending structure 2 has a lower layer 2-1 made of GaN (buffer layer) on the side thereof orientated towards the substrate 1. On this, a transition or intermediate layer 2-2 is disposed, on which in turn a cover layer (upper layer which carries the electrical supply contacts 3*a* and 3*b*) made of AlN is disposed (layer 2-3). This variant comprising a multilayer system with at least two materials (buffer layer and cover layer) has the advantage when choosing, as in the presented case, both materials with as different thermal coefficients of expansion as possible, that the heat transport along the bar longitudinal direction is significantly greater than the heat trans-port perpendicular thereto in the transverse direction in the bar. The illustrated variant optimises the differently pronounced thermal expansion of the upper and the lower layer of the bar. Advantageously, at least one of the layers is hereby configured to be conductive (e.g. by corresponding doping) so that it is heated during current throughflow (impressed via the electrical supply contacts 3*a*, 3*b*). Heating of this type and hence expansion is basically possible also without electrical supply contacts via an external heating system (for instance in a furnace so that a thermal switch can be produced which operates similarly to a standard strain strip). As in the case shown in FIGS. 3 and 4, one of the layers consequently expands here more greatly than the other.

As buffer layer, everything is hereby suitable on which monocrystalline gallium III nitrides can be deposited hexagonally. (It must be taken into account hereby that the lower GaN layer generally always consists of a plurality of layers since a monocrystalline growth directly on the substrate is only possible with difficulty because of the lattice mismatch. Accretion layers for the corresponding semiconductor structures are therefore used which enable mediation between monocrystalline buffer layer and substrate 1. These are generally polycrystalline AlGaN or AlN layers which serve in addition for stress compensation. After a plurality of such layers, a quasi substrate is represented by means of a first layer GaN which is monocrystalline. The layer made of GaN located directly thereon is termed buffer layer in the actual sense since this belongs electrically to the component and must be so thick that the accretion layers have as far as possible no influence on the components. In the case of the mechanical bars produced according to the invention, such accretion layers generally introduce mechanical stress into the layer 2 after detachment from the substrate 1. The result hereof is also the already described bending in the inoperative state. These layers can thereby be reduced or even subsequently etched off).

The electrical supply contacts 3a, 3b to be applied on the layer 2-3 are thereby conceivable everywhere on the surface of the layer 2-3; the only prerequisite is a planar heat introduction into the bar 2 during operation with current or when applying a voltage. In the configuration as a MESFET type (cf. the variants shown in FIGS. 1 and 2), for instance by means of partially doped or undoped group III nitride, a slightly smaller deflection is hereby to be expected in comparison with a bar configured as a heterostructure with an AlGaN cap (with 2D electron gas). A variation of the doping in the case shown here or shown in FIGS. 1 and 2 however offers a possibility of varying the adjustment of the actuation voltage (i.e. that voltage which is required for maximum deflection) within a fairly large range. This is possible in the case of an AlGaN/GaN heterostructure merely to a slightly lesser degree since the maximum thickness of the AlGaN is technically limited.

In the case of the connection of the electrical supply contacts 3 to the corresponding portions on the bending structure 2, the use of conventional soldering techniques is possible. Likewise, the use of so-called "face-to-face" or "back-to-face" techniques with through-contactings (wires) is possible. There is understood by a back-to-face component, a component or bar which is separated in a manner such that the metallisation for the contact stamp or the variable capacitance is located on the underside of the bar (side orientated towards the substrate, "back"). The component is then soldered on the circuit side of the circuit board ("face"). There is understood by a face-to-face component, a component or bar which is produced as just described in the back-to-face component but the metallisation is located on the upper side of the bar ("face"). During soldering, the chip with the actuator must therefore be mounted reversed. The spacing of the bar-signal line of the circuit board can then be adjusted more simply via solder bumps which are applied on the upper side of the GaN bar or the circuit board (the thickness of the substrate 1 which is normally between 100 and 1000 μm must then be bridged here since the bars typically deflect only by 0.5 to approx. 5 μm; in the face-to-face variant, the solder bumps can be applied at the desired thickness corresponding approximately to the deflection).

The construction is hereby possible directly on substrate bases suitable for high frequency which can be provided with solder metallisations. The basic substrate need hereby have no active or passive components (apart from lines) but this may be possible. This applies likewise to the actuators which can have integrated active or passive components on the basis of group III nitrides or also entirely integrated circuits (for instance for actuation of the actuator). According to the invention, encapsulation of the switches and/or varactors according to the invention is possible; the hereby resulting, air-tight chambers can be filled with vacuum or with various gases (mainly inert gases). With the described processes, also multiple solderings or stackings are possible.

According to the invention, the adjustment of the varactors and/or switches according to the invention can be achieved as follows. Measurement of the capacitance is possible on ready processed components and by means of the adjustment of a specific deflection voltage for the desired capacitance. Other components can be pre-adjusted to the same deflection voltage. This can be effected also with a special calibration structure which is constructed as a varactor and/or switch according to the invention and which can be integrated on the circuit board in the case of each more complex component to be constructed. By means of such a procedure, a highly accurate electrical adjustment is possible. This is however only required if very specific values of the capacitance must be set (for instance with a matching circuit of high frequency transistors, the voltage to be applied can be varied interactively until a desired effect takes place, for instance the highest initial power or the best effectiveness). Mechanical adjustment is, as described subsequently in more detail, possible by etching the bar and hence also by the adjustment of a possibly required inoperative position curvature.

The method described subsequently in FIG. 9 for etching the silicon substrate, in order to free the bending structures 2, is only one possibility: typically, a dry etching method from the rear side is used (for instance "ICP Bosch Process" or Cryo ICP etching or the like). In the case of 100 silicon, chemical etching (for instance with KOH) is also possible; in the production of the actuators on other substrates, such as for instance sapphire or silicon carbide, for instance with the help of so-called sacrificial layers (for instance silicon nitride or oxide applied structured on a substrate before the epitaxy of the group III nitrides) so that the group III nitride layers only grow partially directly on the substrate and are partially located above these sacrificial layers, it is also possible to free the bar structures by removing or etching these sacrificial layers.

Figure 9:
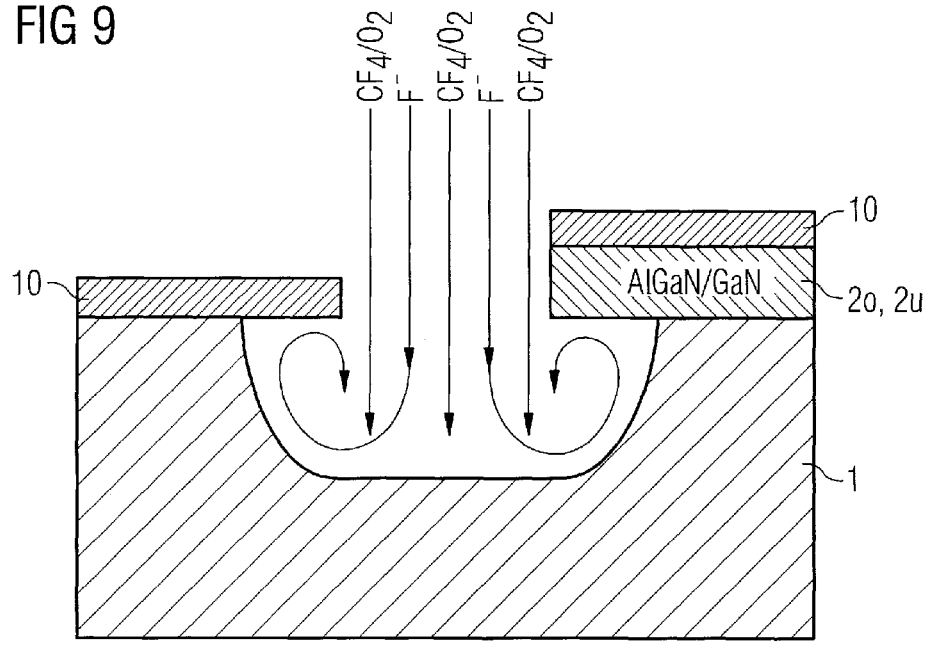
FIG. 9 shows schematically a step, under-etching of a bar structure, during production of a heterostructure actuator element according an exemplary embodiment of the present invention.

FIG. 9 shows schematically an essential step, under-etching of the bar structure 2, during production of a heterostructure actuator element according to the invention. With reference to FIG. 9, the other steps of the semiconductor structuring method for the production of an actuator element according to the invention are mentioned first. Firstly, from the composite comprising AlGaN cover layer 2o and GaN basic layer 2u (here for example cover layer made of $Al_{0.2}Ga_{0.8}N$), a mesa of a desired basic area is etched out in that the heterostructure 2 outwith the basic area is etched away apart from the substrate base 1. The remaining mesa is shown on the right at the top in FIG. 5 (portion 2o, 2u). The regions to be under-etched (mesa region 2o, 2u on the right in the picture and also substrate region on the left in the picture) are covered by an aluminium mask 10. The covered regions are subsequently etched by a reactive ion etching process with the assistance of halogens in the reaction gas: the dry etching method used in the example uses a $CF_4$ plasma which is enriched with oxygen. The etching is effected as a result through a mechanical component ($CF_4/O_2$) which arises by corresponding acceleration of the ions and also a chemical etching component ($F^-$ ions).

Figure 10:
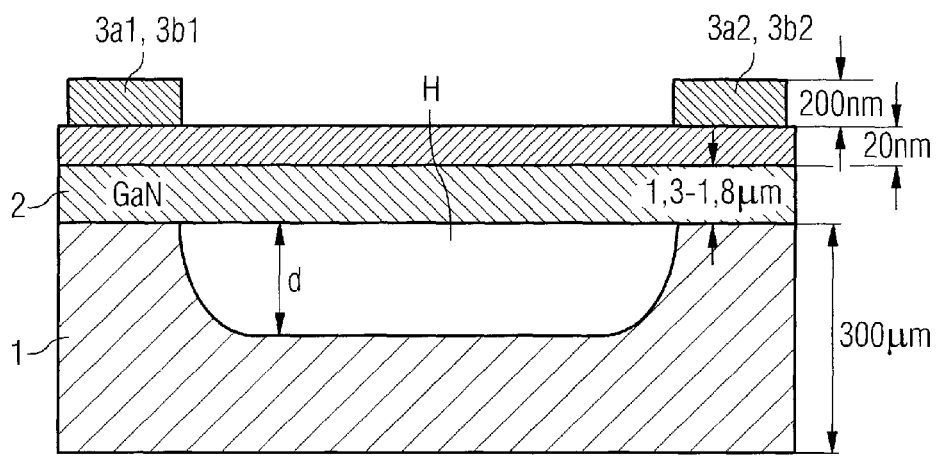
FIG. 10 shows a construction of a cantilevered bar or a cantilevered AlGaN/GaN heterostructure on a silicon substrate.

FIG. 10 shows the basic construction of a cantilevered bar (i.e. which has a spacing region d relative to the substrate) or a cantilevered AlGaN/GaN heterostructure 2 on a silicon substrate 1 which was produced with the help of the etching process described with reference to FIG. 9. The cantilevered bar 2 is supported at the left or at the right end on the silicon substrate 1. In the centre, the schematically illustrated actuator element displays a cavity H under the semiconductor structure 2 which was produced by the etching processes represented in the description of FIG. 9. The depth of the cavity H is approx. d=150 µm. Directly on the upper side (i.e. on the 20 nm thick AlGaN cover layer) of the cantilevered active semiconductor structure 2 there are disposed, as in the case shown in FIG. 2, four electrical supply contacts $3a1$, $3b1$, $3a2$, $3b2$ (these are illustrated here schematically in a simplified form). The electrical contact (element 6, 8) produced when bending or deflecting the bar 2 is not illustrated here in a simplified form.

Figure 11:
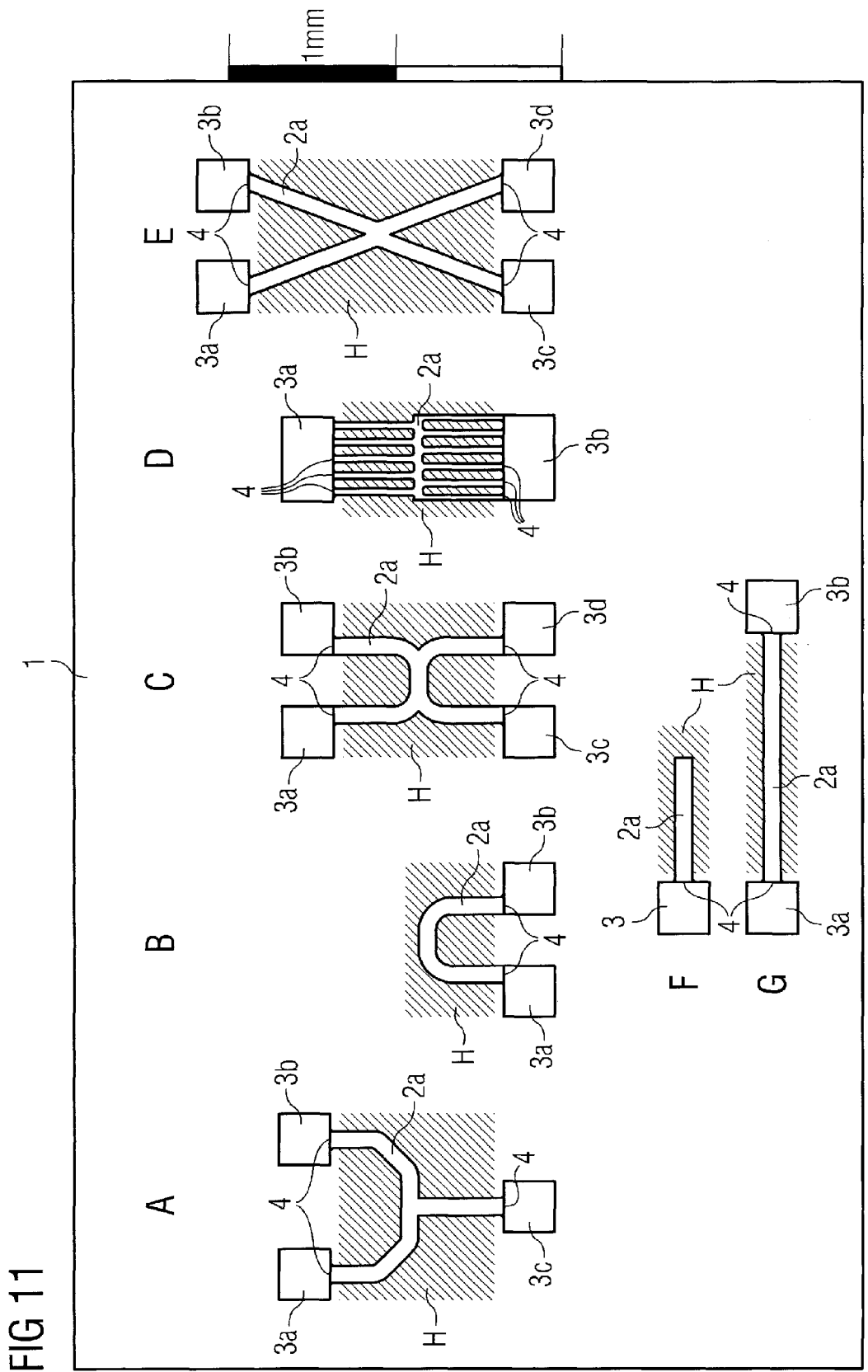
FIGS. 11A-11G shows seven different exemplary embodiments of an actuator element according to the present invention.

FIG. 11 shows various basic forms of semiconductor actuators, as can be produced according to the invention. The electrical supply contacts are illustrated hereby schematically together with the anchor points 4, i.e. one of the square contacts 3 shown has generally, as shown in FIG. 1, a first supply contact in front of the substrate base edge (i.e. on a portion 2b of the bending structure which is supported by means of the substrate base 1) and, on the other side of the substrate base edge, i.e. above the cavity H in the region 2a of the bending structure which is no longer supported, a second electrical supply contact. Adjacent electrical supply contacts (which are to be connected electrically then via a current flow 7a or a voltage 7b) can however also be located together above the cantilevered portion 2a.

FIG. 11 shows seven different embodiments of an actuator element according to the invention. In each of the partial FIGS. 1A to 1G, an embodiment is shown in a view on the substrate base layer 1. Each of the embodiments has a silicon substrate 1 and also, disposed thereon, a homogeneous semiconductor layer 2 or a part, which remains after etching out of a desired geometric structure, of a total layer which previously covered the substrate 1 entirely. A part 2a of the (remaining) homogeneous semiconductor layer 2 has a cantilevered configuration, i.e. disposed above a cavity 6 etched into the substrate 1 such that the cantilevered part 2a can be deflected. The cantilevered part 2a or the homogeneous semiconductor layer 2 is connected to the substrate 1 via a different number of anchor points 4. In FIG. 11A, the cantilevered, deflectable part 2a of the homogeneous semiconductor layer 2 is connected to the substrate base 1 via three anchor points 4 such that the deflectable part 2a is an essentially y-shaped bar. The three anchor points 4 and also the associated contacts 3a-3c are disposed at the three ends of the y- or of the corresponding bar. In FIG. 11B, the cantilevered, deflectable part 2a of the homogeneous semiconductor layer 2 is connected to the substrate base 1 via two anchor points 4, which are situated on the same side of the etched-out cavity H, of the homogeneous semiconductor layer 2 such that the cantilevered, deflectable part 2a essentially represents a U-shaped bar. The two anchor points and the associated contacts 3a to 3b are disposed at the two ends of the U or of the corresponding bar, i.e. therefore on the same side of the cavity H or at an edge side of the cavity H. FIG. 11C and FIG. 11E show a cantilevered, deflectable part 2a which is connected to the substrate base via four anchor points 4 such that the deflectable part 2a essentially represents an X- or H-shaped bar. The four anchor points are disposed at the four ends of the X- or of the H-bar. X- or H-shaped structures offer the advantage of being able to choose different supply paths or being able to select the contacts of the shown contacts 3a to 3d which are used for the electrical supply. FIG. 11D shows a case in which the cantilevered, deflectable part 2a of the homogeneous semiconductor layer 2 is connected to the substrate base 1 via a large number of anchor points 4 such that the cantilevered, deflectable part 2a essentially represents a double comb-shaped bar. The anchor points 4 or contacts 3a, 3b are disposed respectively at the ends of the comb tines or the individually bar ends. Relative to normal straight bars, the comb shape has the advantage of a more sensitive deflection behaviour. FIG. 11F shows the case from FIG. 1 in which a cantilevered, deflectable part 2a of the homogeneous semiconductor layer 2 is connected to the substrate base 1 via precisely one anchor point 4 such that a free-standing, deflectable linear bar is produced. The anchor point 4 is disposed at one of the ends of the bar, the contact 3 at the anchor point 4. FIG. 11G shows a case in which a cantilevered, deflectable part 2a is connected to the substrate base 1 via precisely two anchor points 4 such that a cantilevered linear bar which is clamped on both sides is produced. The two anchor points 4 are located at both ends of the linear bar, just like the associated contacts 3a, 3b. The structures with at least two directly oppositely situated anchor points 4, i.e. viewed from the top with anchor points 4 on two oppositely situated sides of the etched-out cavity 6, have the advantage that, via the corresponding bars by deflection of the centre, straining over the entire surface, i.e. in addition to an elongation and an upsetting in the bending radii, also lengthening of the bar and hence also elongation of the elementary cells can be achieved.

FIG. 12 shows a further possibility according to the invention for producing a semiconductor actuator which enables a transverse deflection (FIG. 12A: view perpendicular to the plane of the circuit board, FIG. 12B: side view perpendicular thereto and perpendicular to the longitudinal direction of the bar). FIG. 12A therefore shows a plan view perpendicular to the plane which is spanned by the two bars 2-1 and 2-2, FIG. 12B shows a side view in the plane perpendicular thereto. The bending structure 2 is produced here as a homogeneous semiconductor structure (GaN, AlN, InN or also as a ternary compound). Ternary compounds are combinations of two main group III elements (Al, In, Ga) with nitrogen (N) to form $In_xAl_{1-x}N$ or $Al_xGa_{1-x}N$ in contrast to the binary materials of group III nitrides (AlN, InN, GaN). In principle, there can be used at any point, according to the invention, instead of a binary material a suitable ternary one or vice versa (with suitable choice of x from [0,1]). Example: AlGaN/GaN can also be used as AlN/GaN variant, as AlN/AlGaN variant, as InAlN/GaN variant or as GaN/AlGaN variant. The bending structure hereby consists of two parallel-disposed individual bars 2-1, 2-2 which are disposed at a spacing from each other with their respective supported portion 2b on the substrate base 1 and project beyond the substrate base edge K with their freestanding portion 2a perpendicular to the edge K. At the end thereof which is free-standing and orientated away from the base 1, the bar structure 2 has an actuator tip 8 made of a metal element which is disposed on the upper side of the bar structure 2 which is orientated away from the substrate base 1 and connects the two parallel-extending bars 2-1 and 2-2. The actuator tip is provided with a reflective layer for example on the side orientated away from the bar structure 2 here and hence can be used as a reflector for laser light. The "thickness" of the metallisation (surface F in FIG. 12B perpendicular to the plane spanned by the bars and on the side orientated away from the substrate) is used as reflector since the latter is subjected to a right-left movement. In the free-standing region 2a between the actuator tip 8 and the substrate base 1, each of the two bars 2-1, 2-2 of the bending structure 2 respectively has on its upper side a first electrical supply contact 3a and, situated opposite the latter, on its underside a second electrical supply contact 3b. During contacting of these two electrical supply contacts (which are situated opposite viewed with respect to the longitudinal direction of the bars) with a voltage, an electrical field E is induced in the bar over the cross-section of the respective bar in the direction perpendicular to the plane spanned by the two bars. If, as shown in FIG. 12A on the left, the first bar 2-1 is poled differently from the second bar 2-2 (so that a field direction of the electrical field E in the bar 2-1 out of the shown plane and, in the bar 2-2, a field direction results opposite thereto into the shown plane), then these fields which are directed vertically opposite to the respective bar effect a different length change per bar (in the longitudinal direction of the bar) in the plane which is spanned by the bars. By means of different electrical fields in the one bar 2-1 and in the other bar 2-2 (also for example due to parallel fields which have a different field strength), a transverse movement (direction Q essentially along the edge K) of the upper region 8 is hence produced.

FIG. 13 shows a further possibility of a double bar which is clamped on both sides and is constructed basically like the variant shown in FIG. 12 but has the actuator tip 8 in the centre of a cantilevered portion 2a of two bars 2-1 and 2-2 which are clamped parallel to each other on both sides.

If now for example a smaller electrical field strength (contacts 3a1, 3b1, 3a2, 3b2 not shown here) is applied to the bar 2.1 than to the bar 2.2 (the direction of both fields is parallel here), then a lateral displacement is produced (direction V in the plane spanned by the bars 2-1 and 2-2 and along the edges K1 and K2) of the bar which is clamped on both sides in the plane which is spanned by the bars 2-1 and 2-2. FIG. 13 hence also shows the plan view on a bar with the possibility of transverse deflection.

FIG. 14 shows a further embodiment of a semiconductor actuator according to the invention: FIG. 14A in plan view perpendicular to the plane of the circuit board, FIG. 14B in side view in the direction of the plane of the circuit board and perpendicular to the longitudinal axis of the bar and FIG. 14C in side view in the plane of the circuit board and in the direction of the longitudinal axis of the bar. The semiconductor actuator here comprises, as in FIG. 12, two free-standing longitudinal bars 2-1 and 2-2 which are disposed parallel to each other and at a spacing from each other on the substrate 1. At the freestanding end thereof which is orientated away from the substrate base 1, the two bars are connected to each other via a transverse bar 2-3. The transverse bar 2-3 typically carries, but not necessarily, a tip 2-4 in the centre between the two bars 2-1 and 2-2 at the side situated opposite these two bars, on which tip for example a conductive contact element (not shown) can be disposed. On the upper side orientated away from the substrate base, each of the two bars 2-1 and 2-2 respectively carries two contacts: an alloyed ohmic contact 3b-1, 3b2 which extends, in the illustrated example, partially in the region 2b above the substrate base and partially in the free-standing region 2a but can also be delimited only on one of the two sides, and at a spacing therefrom in the freestanding portion 2a, a non-alloyed Schottky contact 3a-1, 3a-2. Situated opposite this Schottky contact 3a-1, 3a-2 there is located respectively a second, non-alloyed Schottky contact 3c-1, 3c-2 on the underside of the free-standing bar portion 3a.

The illustrated bar construction can now perform a circular movement, as indicated in FIG. 14C, by means of suitable connection of the contacts and a consequently caused combination of a longitudinal elongation or longitudinal upsetting and an upward or downward movement (FIG. 14C shows a view in the direction of the bar longitudinal axis L, see FIG. 14A). With suitable choice of the electrical fields applied to the respective bar 2-1 and 2-2 (see also explanations relating to the preceding Figures), there is produced, when applying voltages between the contacts 3a-1 and 3c-1 and also between 3a-2 and 3c2 (connection IB), a movement in that plane which is spanned by the two bars 2-1 and 2-2 (left-right movement in FIG. 14A due to different longitudinal elongations or upsettings of the two bars 2-1 and 2-2). By applying voltages between the contacts 3b-1 and 3a-1 and also between 3b-2 and 3a-2 (connection VB) there is produced a movement vertical to the plane which is spanned by the two bars (this corresponds to a movement as described in FIG. 1). By combining the two described voltage circuits, a movement is then possible, as shown in FIG. 14C. In an alternative variant, also the ohm contact 3b-1 or 3b-2 can hereby be disposed on the underside in the region 2a of the bars.

Figure 15:
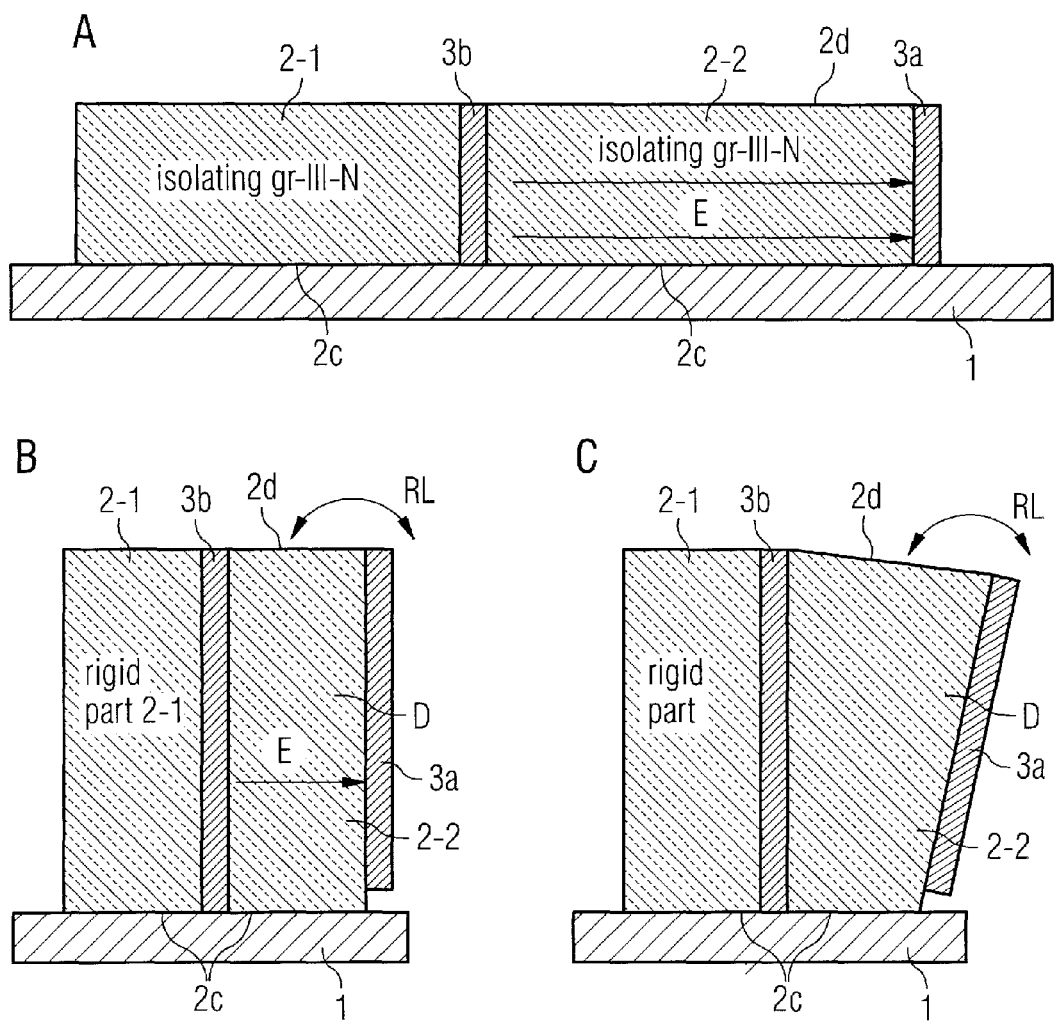
FIG. 15 shows a further exemplary embodiment of a semiconductor actuator according to the invention.

FIG. 15 shows a further variant of a semiconductor actuator according to the invention. In order to construct this semiconductor actuator, a block 1 comprising a silicon substrate is used. The substrate used is hereby a substrate with a different crystal orientation, not a 111 Si substrate (for instance a 100 Si substrate or a sapphire substrate with orientation R-plane (1-102) or A-plane (11-20) instead of C-plane (0001)). This has the effect that the dipole of the semi-conductor compound, which normally stands vertically on the 111 Si substrate or perpendicular to the substrate, on the basis of nitrides of main group III elements is tilted for better efficiency in the wafer plane: by using such a substrate and suitable growth conditions, this dipole is no longer at a right angle but diagonal or at an angle of less than 90° to the interface between substrate 1 and semiconductor structure 2 (see preceding sections of the description for using the 100 or 110 substrates).

Abutting against the substrate block 1, a block 2 comprising homogeneous GaN (this can alternatively concern also AlN, InN or a ternary compound) is disposed. In this block, standing centrally and perpendicular to the substrate block 1, a conductive layer or an electrode 3b has been produced by implantation. Due to this electrode 3b, the block comprising GaN is hence subdivided into a first region 2-1 (subsequently: rigid part) and a second region 2-2 (subsequently: elongatable or upsettable region). Both parts 2-1 and 2-2 or the block 2 are connected securely to the base 1 at the side thereof orientated towards the base 1 (interface 2c). On the side of the elongatable or upsettable region 2-2 which is situated opposite the electrode 3b, a second electrode 3a (metal layer) is applied on the surface thereof which abuts against the substrate block 1 and stands perpendicular to the surface of the substrate block 1. By applying a voltage between the two electrodes 3b and 3a, an electrical field E can hence be generated in the elongatable or upsettable region 2-2. The elongatable or upsettable region is also designated with the letter D. If a voltage is now applied between these two electrodes, then an effective right-left movement RL can be produced since the material of the D region can be elongated or upset by the electrical field E on the side 2d orientated away from the substrate block 1 (according to the field direction). On the side 2c orientated towards the substrate 1, no elongation or upsetting of the D region 2-2 takes place since this side is connected securely to the substrate base 1. During such an elongation or upsetting, the rigid part 2-1 changes its position only slightly since the latter is likewise connected securely to the substrate 1 and since no electrical field E is produced therein (a similar construction to the case of a classic bimetal is hence present).

According to the geometry and material parameters, the result can however be also a slight deflection of the rigid part.

FIG. 16 shows a symmetrical construction which is based on the construction shown in FIG. 15: in addition, a second electrode 3a-2 is also disposed here on the side of the GaN structure 2 which is situated opposite the electrode 3a (here: 3a-1). Hence, an electrical field E can also be generated in the previously rigid region 2-1. If hence for example a connection as shown in FIG. 16A is effected, namely that the middle central electrode 3b is earthed, that the electrode 3a-1 is supplied with a negative potential V (FIG. 16A) and that likewise the electrode 3a-2 is supplied with a negative potential V, then the movement shown in FIG. 16B is produced: the GaN portion 2-2 is subjected to an elongation D on the side 2d thereof orientated towards the substrate block 1, whilst, because of the reverse field direction present in the portion 2-1, in this GaN portion on the side 2d orientated away from the substrate base 1, an upsetting S results. When applying positive potentials to the electrodes 3a2 and 3a-1, this can be reversed so that, in the region 2-1, an elongation D is effected and in the region 2-2 an upsetting S. This is characterised in the Figures by the references SD and DS.

FIG. 17 shows a further variant which is constructed basically similarly to the variants shown in FIGS. 15 and 16. In this case however the middle central electrode 3b is dispensed with. Hence a block comprising GaN which is disposed on the substrate base 1 is produced in FIGS. 17A and 17B, at the two front ends of which block, which stand perpendicular to the substrate block 1 and abut against the substrate block 1, respectively metal electrodes 3a-1 and 3a-2 are configured. This variant was produced such that the C-axis of the piezo-dipole of the GaN block extends parallel to the interface between the substrate block 1 and GaN block 2 (see FIG. 17A). If now a voltage is applied between the electrodes 3a-1 and 3a-2 (see variant a in FIG. 17B), the result on the side 2d of the GaN block 2 which is orientated away from the substrate block 1 is an elongation or upsetting DS according to the field strength applied. This centre M of the GaN block therefore remains at rest, i.e. is not deflected.

FIG. 17C shows a further variant (variant b) in which the electrodes 3a-1 and 3a-2 are disposed not on the front ends of the GaN block 2 which stand perpendicular to the substrate 1 but in which the electrode 3a-1 is incorporated abutting against the substrate base 1 and between the latter and the GaN block 2 and in which the electrode 3a-2 is applied on the side 2d of the GaN block 2 which is orientated away from the substrate base. If now a voltage is applied here between these two electrodes and hence an electrical field E is produced in block 2 then the result, according to the field strength and field direction applied, is an elongation or upsetting DS perpendicular to the interface between substrate base 1 and block 2 or electrode 3a-1, i.e. in the direction of the electrical field E. The length change is designated here with the letter L.

FIGS. 15 to 17 hereby describe the optimum case in which it was achieved epitaxially by suitable choice of substrate and/or substrate preparation and growth conditions to tilt the c-axis of the GaN crystal (and hence the dipole) in the wafer plane (parallel to the interface between substrate 1 and semiconductor structure 2). Of course all the intermediate steps of the dipole orientation are hereby conceivable, i.e. also angles between the mentioned interface and the dipole of greater than 0° and less than 90°.

Figure 18:
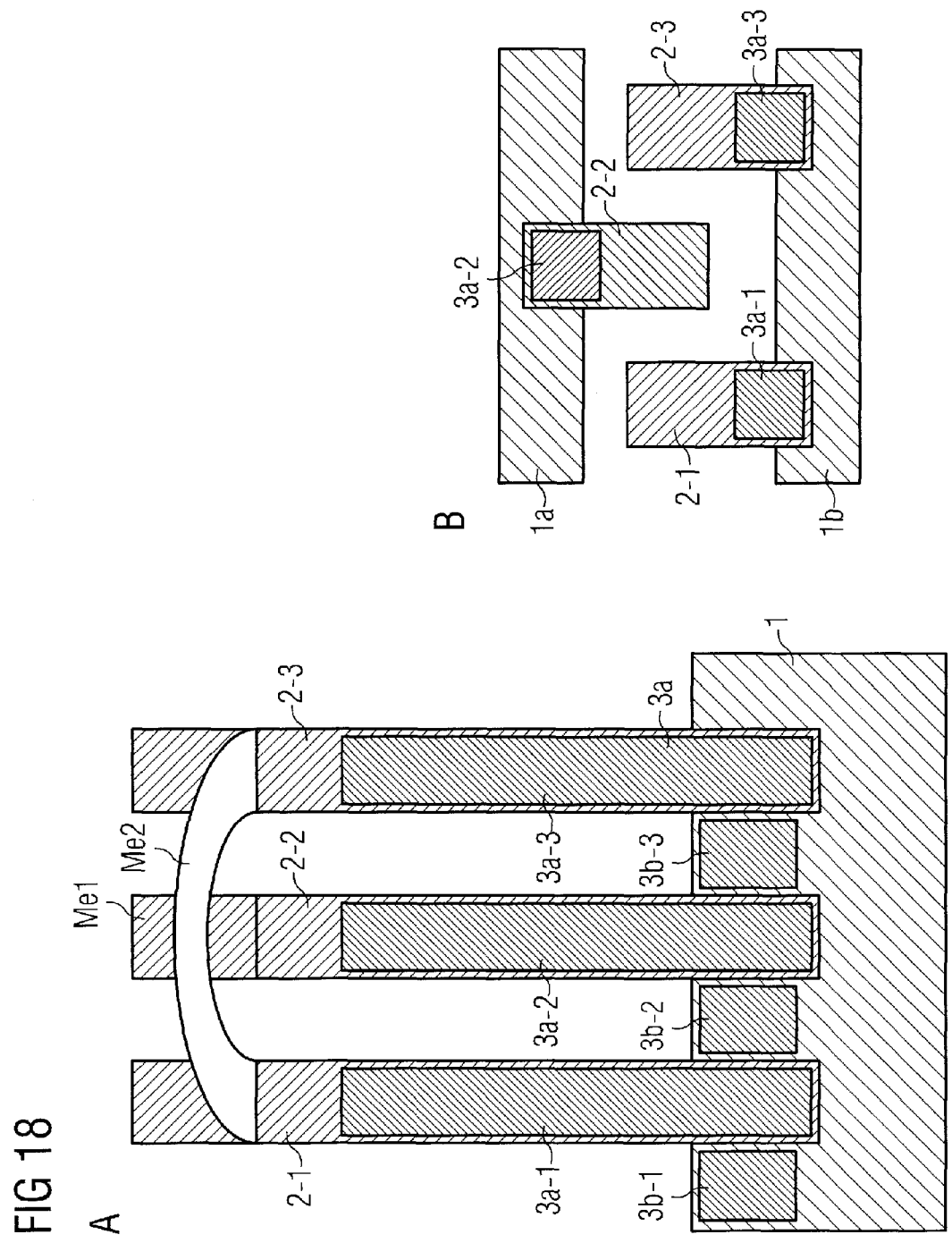
FIGS. 18A and 18B show further exemplary embodiments of a varactor of a semiconductor actuator according to the present invention.

A further embodiment for a varactor of a semiconductor actuator according to the invention is shown in FIG. 18 (plan view on the plane of the circuit board, circuit board not shown). There are disposed parallel to each other and at a spacing from each other on the substrate base 1, three free-standing bars 2-1, 2-2 and 2-3. Each of these bars 2 is configured as a heterostructure, as was described for example in FIG. 3. There are shown the upper contacts 3a-1, 3a-2, 3a-3, respectively on the upper side of the respective bar. In the illustrated example, extending from the supported region 2b of the bars as far as the free-standing region 2a. This geometry is however not absolutely necessary (the contacts 3a-1, 3a-2, 3a-3 are partial or full-surface contacts on the bar upper sides with a variable geometry; merely the contacting to a voltage supply for the deflection of the actuator need to be ensured. The dimension and position of the contact surfaces on the bar upper side affects the efficiency of the deflection and the achievable deflection). The heterostructure interface electrode is not visible here because of the chosen plan view; only one part of an electrical contact is visible which contacts this heterostructure interface electrode here in the example laterally (on the substrate base 1, respectively alloyed ohm contacts 3b-1, 3b-2 and 3-3 which are disposed laterally next to the bar portions 2b and respectively contact the 2D electron gases of the individual bars 2-1, 2-2 and 2-3). Almost any form and position is possible also for the size and position of these contacts since only one connection to the 2D electron gas or to the conductive channel need be made possible. Therefore, it is always possible also to use a common contact for a plurality of bars if the 2D electron gas is not interrupted (for instance due to etching). The contacts 3a-1, 3a-2 and 3a-3 are configured respectively as non-alloyed Schottky contacts. By applying voltages between the respective contacts 3a and 3b, the bars can be operated independently of each other. Each bar can hence be deflected individually vertically to the shown plane when applying a corresponding voltage. On the free-standing end situated opposite the substrate base 1, the central bar 2-2 which is disposed between the two bars 2-1 and 2-3 now has a metallisation Me1 on its upper side. The two outer bars 2-1 and 2-3 have, at the free-standing end thereof orientated away from the substrate base 1, an electrically conductive connection Me2 which is configured as a metallised bridge which extends beyond the bar 2-2 such that, in the inoperative position, the metallisation Me1 and the metallisation Me2 do not touch. By suitable application of a voltage either to the bars 2-1 and 2-3 or to the bar 2-2 (the two bars 2-1 and 2-2 are operated here respectively in parallel with the same voltage), the spacing between the metallisation Me1 and the metallisation Me2 can be reduced (operation for instance as varactor) or can even close a contact (operation as switch): bar 2-2 is hence is operated or deflected individually and with a different voltage (here: between the electrodes 3a-2 and 3b-2) between the two other bars 2-1 and 2-3 which are supplied respectively with the same voltage. Relative to this variant shown in FIG. 18A, the variant shown in FIG. 18B differs in that merely the two bars 2-1 and 2-3 are disposed on a first substrate base (here: 1b) (the metallisations were omitted in order to simplify the illustration). A second substrate base 1a is then disposed at a spacing relative to the substrate base 1b on the circuit board, not shown, on which base the central bar 2-2 is applied. This bar 2-2 hence projects from the opposite side like a zip between the two bars 2-1 and 2-3. The substrate base 1a can thereby be configured as a second substrate base which is produced separately from the substrate base 1b. It is however also possible to produce the bases 1a, 1b directly as a single chip (the residual substrate component which is required for this purpose, remains after the etching and surrounds the arrangement externally in order that a stable mechanical connection is maintained, is not shown). The advantage of the latter production: no adjustment is required which demands high adjustment accuracy. The advantage of the arrangement shown in FIG. 18B is that the space can be used for supply lines and circuits on both sides. In addition (as shown subsequently in FIG. 19A), two switches can be coupled to each other capacitively or also, as described subsequently in more detail, inductively.

FIG. 19 now shows how an electrical useful signal can be guided during the deflection of the bars, as shown in FIG. 18, (FIG. 19 likewise shows views on the plane of the circuit board (circuit board not shown)): the deflection of the bars then changes the capacitance in the signal path (the electrical useful signal can hence be guided along the bars). FIG. 19A shows the variant shown in FIG. 18B. On the surface of the bars 2-1 and 2-3 and also on the abutting supporting substrate 1b, a signal path Me2 can be detected here which comprises the bridge portion already described above in FIG. 18, two portions which extend parallel to the bar longitudinal axis of the bars 2-1 and 2-3 on the surfaces thereof and also a portion which is connected perpendicular to these portions and to both portions on the bars and extends on the substrate 1b (all these portions are designated here with the reference number Me2). On the bar 2-2 which protrudes from the opposite side there extends likewise a part of a signal path portion Me1, the latter comprising a portion which extends parallel to the longitudinal axis of the bar on the surface of the bar 2-2 and also a portion which extends perpendicular thereto on the surface of the substrate 1a.

FIG. 19B shows a further variant of a varactor according to the invention: the substrate 1c here has a U-shaped configuration. The base of the U carries the central bar 2-2, whilst the two legs of the U carry respectively one of the bars 2-1 and 2-3 at the ends thereof which are orientated away from the base of the U. The bars 2-1 and 2-3 are hereby disposed perpendicular to the longitudinal axis of the U legs, hence project at a 90° angle into the inner area of the U, i.e. with their longitudinal axis perpendicular to the longitudinal axis of the bar 2-2. The two bars 2-1 and 2-3 are equipped on their surface once again with a bridge portion which, like the previously described bridge portions, extends in the inoperative position at a spacing relative to the metallisation Me1 of the bar 2-2 above the latter. Further portions of the signal path Me2 of the bars 2-1 and 2-3 extend along the bar longitudinal axis of the bars 2-1 and 2-3 on the surface thereof and also at a 90° angle thereto along the longitudinal axes of the U legs. Here also, due to a change in the spacing of the metallisation Me1 relative to the bridge portion of the metallisation Me2, the capacitance of the signal path can be changed.

FIG. 19C shows a further variant which is constructed basically like the variant shown in FIG. 19B apart from the subsequently described differences. The bar 2-2 hereby carries, on its upper side next to the metallisation Me2 at the free-standing end and also at a spacing therefrom, a non-alloyed Schottky contact 3a-2 (which extends in the example from the free-standing region 2a into the supporting region 2b of the bar and on the upper side thereof, also other geometries being permissible as described previously) and also an alloyed ohm contact 3b-2 which is disposed in the example at the supported end of the bar at a spacing from the Schottky contact 3a-2 relative to the contacting corresponding to FIG. 1 or FIG. 3. It applies here also that, as described above, an almost arbitrary shape and position is possible if a connection to the 2D electron gas or to the conductive channel of the bar is made possible. The metal pad Me2 on the bar 2-2 can hereby be provided with an insulation layer on the side thereof orientated away from the bar surface (for example SiN, SiO$_2$ or Al$_2$O$_3$). This insulation layer serves to prevent adhesion to the bridge portion of the metallisation Me1 which is described subsequently in even more detail. The provision of such an insulation layer is however not necessary: an electrically conductive contact is indeed not necessary in the case of the capacitive coupling in which, as described already, the capacitance is changed with the spacing of the elements (an inductive coupling, as is described subsequently in even more detail, is also possible). The insulation layer is therefore used for the purpose of influencing the dielectric constant during the capacitive coupling and of avoiding adhesion of the two metals (if in fact a contact takes place).

The two U legs now have, in contrast to the case shown in FIG. 19B, no bar structures, hence the elements 2-1 and 2-3 are dispensed with here. Instead, a bridge portion of the metallisation Me1 which extends from one to the other U leg extends at the level of the free-standing end of the bar 2-2, i.e. above the metal pad Me2. Only on one of the U legs (here: lower leg) does a further line element of the metallisation Me1 extend, starting then from the end of the bridge portion, on the surface of the U leg of the substrate base 1 in the form of a high frequency signal path (RF signal path). This one-sided configuration is also termed "matching stub". In the case of such a "matching stub", merely one "landing surface" of the metallisation Me1 is formed on the one side (upper U leg), whilst, on the other side (lower U leg), a "stub" connection of the metallisation leads from the bridge element to the RF signal path. Of course, it is also correspondingly possible to equip one or both sides with a bar 2-1 or 2-3, as is shown in FIG. 19B. The configuration as matching stub with only a one-sided supply line of a connection can however also undergo a connection as shown for example in FIG. 7B (a supply line on both sides therefore being effected).

Figure 20:
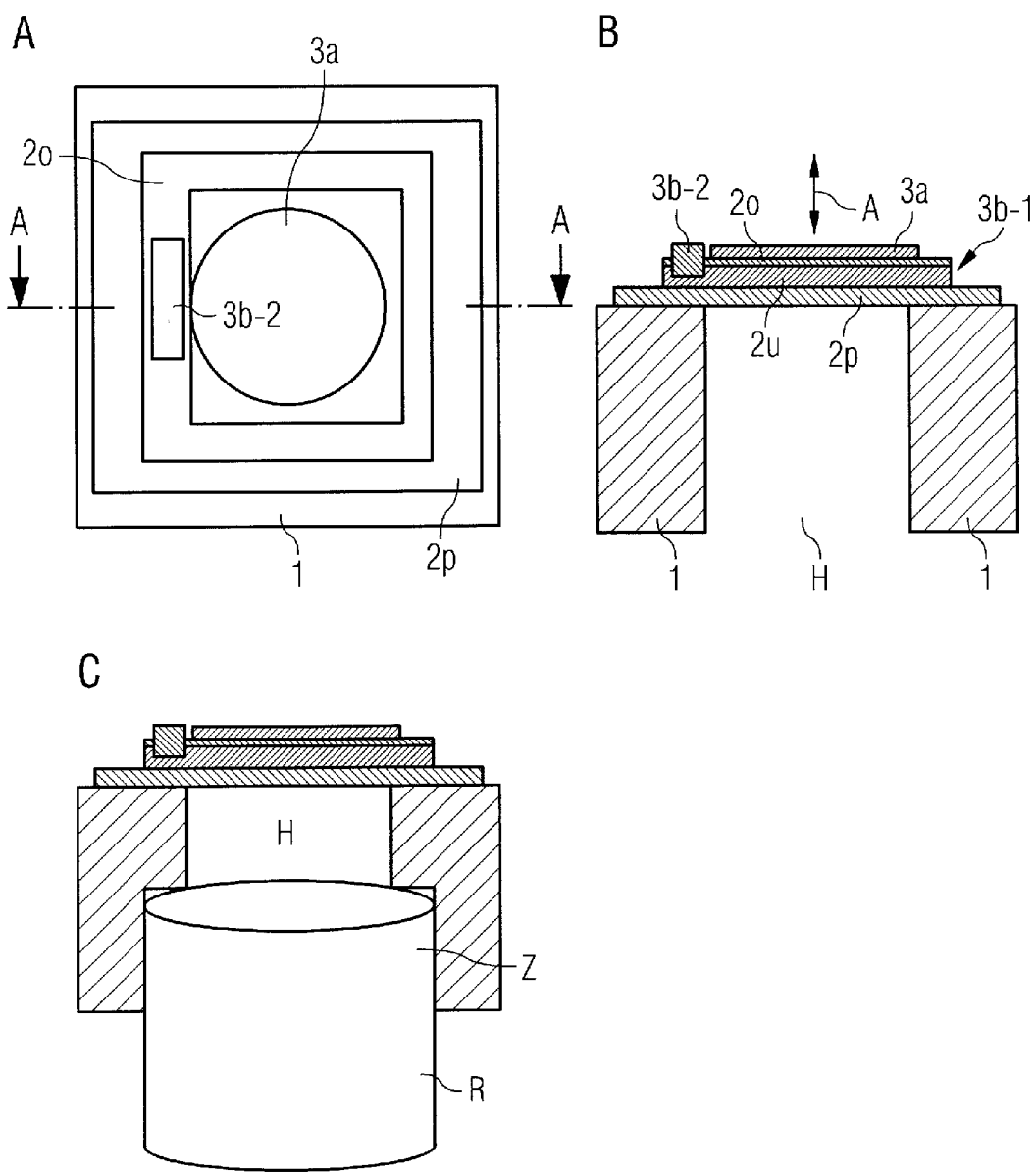

FIG. 20 shows a further embodiment in which the semiconductor actuator according to the invention is configured as a micromechanical membrane pump in which a membrane is raised and lowered. FIG. 20A shows a view on this membrane pump, FIG. 20B a sectional view perpendicular thereto along the section line A-A. The substrate 1 here is configured as a cuboid block out of which in the centre a cylindrical cavity H has been etched out (in the view from above: circularly illustrated region in the contact region 3a) so that, of the original substrate block, merely side walls 1 which surround this cavity H at the outer circumference remain standing. The cavity H is then, as described subsequently in more detail, covered completely by a semiconductor buffer layer and an active semiconductive layer towards the upper side, i.e. towards the side orientated away from the circuit board. In order to achieve this, the buffer layer 2p (in the example here rectangular, but not necessarily) comprising a semiconductor compound on the basis of nitrides of main group III elements is situated completely along the outer circumference thereof and centred on the substrate walls 1. On this buffer layer 2p, an active layer (in the example here also rectangular, but not necessarily) comprising an AlGaN/GaN heterostructure which is configured in principle like the structure shown in FIG. 3 is disposed: between the upper AlGaN layer 2o and the lower GaN layer 2u, the 2DEG 3b-1 is disposed as first electrode. The latter is contacted laterally via the electrode 3b-2. The planar metal electrode 3a is located on the surface of the upper layer 2o. By applying an electrical voltage or by impressing an electrical current on or in the electrodes 3a and 3b, the membrane formed from the components 3a, 3b-1, 3b-2, 2o, 2u and 2p can hence be deflected in the direction parallel to the side walls 1 or perpendicular to the plane of the circuit board (circuit board not shown) (direction A).

The simplest layout shown here includes only one membrane and the two control contacts 3a, 3b (the electrical supply lines or corresponding connections are not shown here). However virtually any other layouts are conceivable, round membranes being preferred. The component shown here must be applied on a carrier (or on the not-shown circuit board) in a sealed manner in order to pump for example a liquid, this carrier or the circuit board then having liquid lines. The component illustrated here can then exert pressure from above onto a liquid by means of mechanical excitation and hence pump said liquid. Suitable embodiments of the capillary systems on the carrier or on the circuit board can thereby also ensure a specific flow direction.

Another possibility for construction is the attachment of such a micropump to a tube or a cylinder or the like, the side walls 1 as shown in FIG. 20C being sealed between the tube R or the cylinder. This is achieved in FIG. 20C in that, on the side orientated away from the membrane, the side walls 1 have, on their inner side (i.e. on the side orientated towards the cavity H), a cut-out Z into which the tube R or the cylinder is fitted or inserted in a form fit in a sealing manner. The tube R or the cylinder can then again be used or constructed as a transfer to another carrier capillary system. The cut-out Z can hereby be configured, as described previously, as an adaptor fit in that the corresponding internal regions of the substrate walls 1 are etched away.

Figure 21:
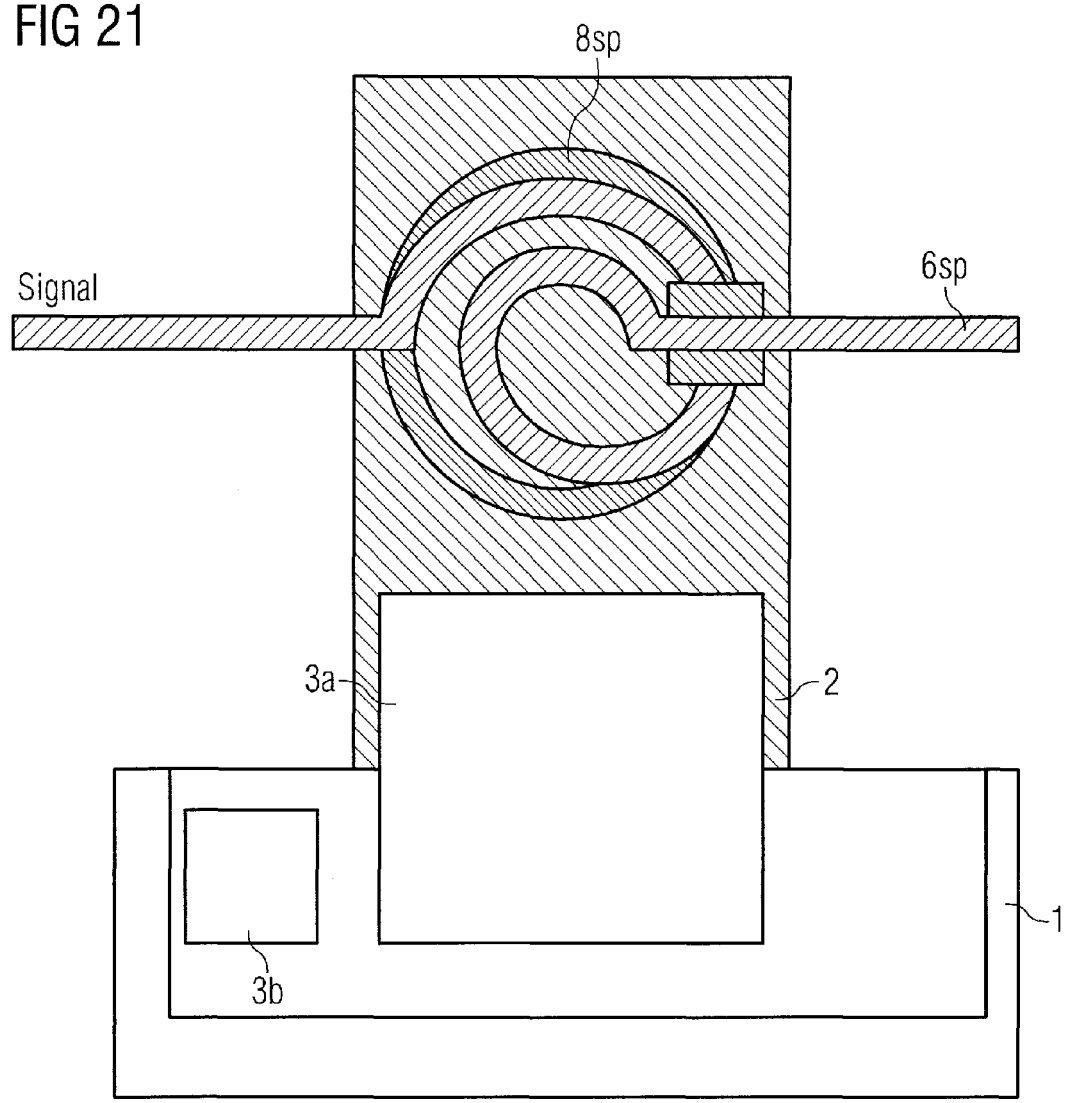
FIG. 21 shows a further exemplary embodiment of a semiconductor actuator according to the invention.

FIG. 21 shows a further embodiment in which the semiconductor actuator according to the invention is configured as a variable coil. The basic construction is hereby produced analogously to the construction shown in FIG. 1 or 3: free-standing bar 2 made of a (partially) doped homogeneous group III nitride layer or group III nitride heterostructure (for instance AlGaN/GaN) which is contacted on the upper side thereof by a metallic planar electrode 3a and, at the 2DEG interface thereof (not shown), by an electrode 3b laterally. On the underside (i.e. the side orientated towards the not-illustrated circuit board 5), the free-standing bar 2 carries, on the side orientated away from the substrate base 1, a metallisation 8sp which is applied in the form of a coil winding. Opposite this metallisation 8sp, a corresponding metallisation 6sp is applied on the surface of the circuit board 5. The signal line 6sp disposed on the circuit board 5 hence has, instead of a simple line, a coil which is situated in the plane. The metallisation 6sp can hereby be produced in the form of a circle or a planar coil (this applies likewise to the metallisation 8sp applied on the underside of the bar). If now, as previously described, the bar is deflected, then, because of the variation in spacing between the signal line coil 6sp and the coil 8sp disposed on the underside of the bar, a coupling of the magnetic fields of the two windings 6sp and 8sp is produced; hence the induction value L of the arrangement changes as a function of this spacing. The coil 8sp can be subjected to a flow for this purpose (however, merely the presence of the metallic coil winding 8sp already suffices).

The variable coil can also be produced in the so-called "face-down-technique" corresponding to FIG. 6B. Viewed with respect to the substrate 1, the coil winding 8sp is then located on the upper side of the bar. In this illustrated case, the bar was constructed as an AlGaN/GaN heterostructure.

Figure 22:
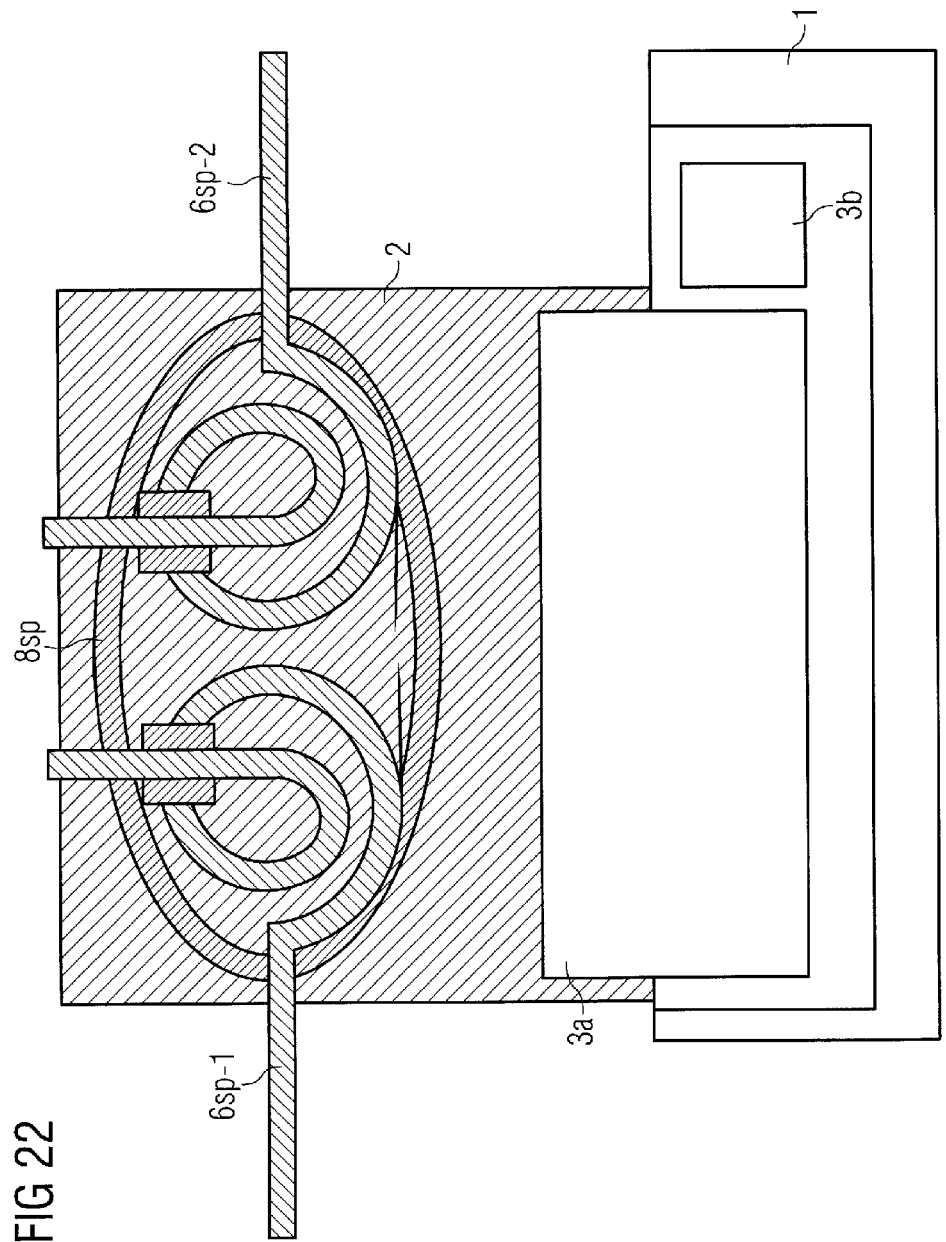
FIG. 22 shows a further exemplary embodiment according to the present invention in which a variable coupler is produced.

FIG. 22 shows a further embodiment according to the invention in which a variable coupler is produced. The basic construction hereby corresponds to that shown in FIG. 21. In this embodiment also the change in the induction value L by means of a coupling of magnetic fields is utilised. In this embodiment, in contrast to that shown in FIG. 21, two planar coils which are situated adjacently but have no direct contact (for instance via a signal line) are applied laterally on the circuit board 5 adjacently: the signal line 6sp-1 hence includes a first planar coil, the signal line 6sp-2 which is disposed adjacently a second coil. The bar 2 is now produced such that its free-standing end covers the two coil windings 6sp-1 and 6sp-2: on the underside thereof orientated towards the circuit board 5, the bar has a coil winding 8sp at the free-standing end thereof, the diameter of which coil winding is at least as large as the total diameter of the two adjacently situated coils 6sp-1, 6sp-2 on the circuit board 5 (if the surface enclosed by the coil windings 8sp were hence to project perpendicular to the circuit board plane, then this surface would cover the total surface enclosed by the two coil windings 6sp-1 and 6sp-2). By reducing the spacing of the bar 2 above the two coils 6sp-1, 6sp-2, coupling of the two coils 6sp-1, 6sp-2 can now be achieved, as a result of which for example two circuits which are connected to the two signal lines can be coupled together.

In a further embodiment, the actuator according to the invention can also be configured such that the detection of substances, in particular the selective detection of gases and/or liquids, is possible therewith. For this purpose, at least one partial region of the surface of the bending structure 2 is provided with an adsorbing and/or absorbing coating. If adsorption is mentioned subsequently for simplicity, then adsorption and/or absorption can be intended. This coating is advantageously constructed such that it enables merely the adsorption of specific, pre-defined gases or liquids. The adsorbing coating can however also be configured such that it makes possible in general the adsorption of gases and/or liquids (non-selective adsorption).

Because of the previously described adsorbing coating, the mechanical resonance frequency of the actuator changes with the occurrence or binding of gas and/or liquid molecules of preferably a specific sort to the surface of the bending structure: such a change occurs since, because of the particles which impact with an impulse, the resonance frequency changes purely mechanically by transmission of the impulse and/or because, due to chemical bonding to the surface (coating), the mass and/or also the dipole moment or the charge of the particles have an effect on the actuator and change the resonance frequency.

This change in the mechanical resonance frequency can then be used as in a fingerprint for establishing that sort of particles which has accumulated on the surface of the bending structure. For this purpose, the construction of the bending structure is configured such that the component is synchronised to a specific resonance frequency (for example of 1 MHz) if no additional accumulation of particles is effected: if hence the component is excited without additionally accumulated particles by means of for example an excitation generator such that the resonance frequency is encountered, then the result is maximum deflection of the bending structure. After accumulation of the species on the surface, the mass of the bending structure changes such that a different resonance frequency is produced. By maintaining the excitation conditions of the excitation generator, the deflection is hence reduced (no longer maximum deflection), which can be established in the manner known to the person skilled in the art.

In order to determine a plurality of sorts of particles, a series of differently coated elements can be used. A bending structure can also be coated differently at various positions (since the resonance frequency will change differently according to where on the bar molecules impact, this locational dependency can also be used to determine the selection).

In addition, it is possible to use an actuator according to the invention as sound source: since the bending structures, as described previously, can be adapted to a specific resonance- or operating frequency (by means of suitable geometric configuration), this can be used in principle also as sound transmitter by impressing an alternating voltage of a defined frequency on the electrodes 3.

The invention claimed is:

1. A semiconductor actuator, comprising:
a substrate base;
a bending structure connected to the substrate base and deflectable at least partially relative to the substrate base, the bending structure having semiconductor compounds of nitrides of main group III elements; and
at least two electrical supply contacts which one of (a) impressing an electrical current in and (b) applying an electrical voltage to the bending structure, the at least two of the supply contacts being at least one of (a) disposed at a spacing from each other respectively on the bending structure and (b) integrated in the bending structure,
wherein the bending structure is securely connected in selected portions to the substrate base, the bending structure being cantilevered and deflectable in further selected portions relative to the substrate base,
wherein the bending structure has at least one of a homogeneous semiconductor layer and a semiconductor hetero structure, and
wherein at least one of (a) the homogeneous semiconductor structure comprises or consists of one of GaN, InN and AlN and (b) the semiconductor heterostructure has a first structure made of one of GaN, InN and AlN and a second structure made of one of AlxGa1-xN, InxGa1-xN and InxAl1-xN.

2. The semiconductor actuator according to claim 1, wherein the bending structure is connected at least one end of the cantilevered region thereof via an anchor portion to the substrate base and is arranged thereon.

3. The semiconductor actuator according to claim 1, wherein the bending structure is connected at least two ends of the cantilevered region thereof respectively via an anchor portion to the substrate base and is arranged thereon.

4. The semiconductor actuator according to claim 1, wherein the bending structure is securely connected to the substrate base, the bending structure being deflected relative to the substrate base at one end which is orientated away from the substrate base.

5. The semiconductor actuator according to claim 4, wherein at least a part of the bending structure is deflected one of (a) substantially perpendicular to a connection region (length change) and (b) substantially in a direction of the connection region (transverse deflection).

6. The semiconductor actuator according to claim 1, wherein the bending structure has at least one bar.

7. The semiconductor actuator according to claim 6, wherein a type of the at least one bar is one of a cantilevered bar and a free-standing bar.

8. The semiconductor actuator according to claim 1, wherein at least a partial portion of the hetero structure is at least one of (a) configured as at least a partial portion of one of the electrical supply contacts and (b) contacted electrically via at least one partial portion of one of the electrical supply contacts.

9. The semiconductor actuator according to claim 8, wherein at least one of the electrical supply contacts is at least one of (a) disposed at least partially on a side of the bending structure which is orientated away from the substrate base (upper side of the bending structure); (b) disposed at least partially on a side of the bending structure which is orientated towards the substrate base (underside of the bending structure); and (c) disposed integrally at least partially in the bending structure.

10. The semiconductor actuator according to claim 9, wherein at least one of the electrical supply contacts is disposed integrally between the upper side and the underside of the bending structure in the underside.

11. The semiconductor actuator according to claim 9, wherein one of the supply contacts is disposed one of (a) at least partially on the upper side of the bending structure and (b) at least partially on the underside of the bending structure, another one of the supply contacts being one of (a) at least partially on the underside of the bending structure and (b) at least partially in the bending structure.

12. The semiconductor actuator according to claim 9, wherein the supply contact which is disposed at least partially integrated in the bending structure encloses a heterostructure interface.

13. The semiconductor actuator according to claim 9, wherein at least one of the electrical supply contacts is one of (a) disposed in and (b) disposed on the cantilevered portion of the bending structure.

14. The semiconductor actuator according to claim 13, wherein a further electrical supply contact of the supply contacts is one of (a) disposed in and (b) disposed on the portion of the bending structure which is connected securely to the substrate base.

15. The semiconductor actuator according to claim 14, wherein both (a) the supply contact which is disposed on the cantilevered portion and (b) the electrical supply contact which is disposed on the portion are disposed on the upper side of the bending structure.

16. The semiconductor actuator according to claim 9, wherein at least two of the supply contacts are disposed at a spacing from each other on the upper side of the bending structure.

17. The semiconductor actuator according to claim 1, wherein the substrate base one of (a) comprises of silicon Si and (b) consists of silicon Si.

18. The semiconductor actuator according to claim 17, wherein the substrate base has at least one of a 111 Si substrate, a 100 Si substrate and a 110 Si substrate.

19. The semiconductor actuator according to claim 1, further comprising:
an electrically conductive contact element disposed on the deflectable portion of the bending structure.

20. The semiconductor actuator according to claim 19, wherein the conductive contact element is disposed on at least one of the cantilevered portion and a free-standing end of the bending structure.

21. The semiconductor actuator according to claim 19, wherein the contact element has at least one of a metal layer, an alloy layer and a light-reflecting layer.

22. The semiconductor actuator according to claim 1, wherein the bending structure has two bars which includes at least one of two cantilevered bars and two free-standing bars, each of the bars being connected to the substrate base at least one end via an anchor portion and being arranged on the substrate base.

23. The semiconductor actuator according to claim 22, wherein the two bars are disposed substantially parallel to each other.

24. The semiconductor actuator according to claim 22, wherein each of the two bars has on the upper side of at least one of the cantilevered and free-standing portion thereof, (a) a first electrical supply contact situated opposite the second first electrical supply contact on an underside of at least one of the cantilevered and free-standing portion thereof; (b) a second electrical supply contact on at least one of an upper side and the underside of at least one of the cantilevered and free-standing portion thereof and one of the upper side and the underside of the portion thereof connected to the substrate base; and (c) a third electrical supply contact at a spacing laterally from the first and second electrical supply contacts.

25. The semiconductor actuator according to claim 1, wherein one of the electrical supply contacts is disposed on a surface of the bending structure, the bending structure having at least three layers: (1) a first layer having semiconductor compounds on the basis of nitrides of main group III elements, (2) a second layer disposed abutting thereon and configured as a further one of the electrical supply contacts and (3) a third layer abutting thereon and having semiconductor compounds on the basis of nitrides of main group III elements.

26. The semiconductor actuator according to claim 25, wherein at least one of the first layer comprises GaN, the second layer comprises doped Si and the third layer comprises GaN.

27. The semiconductor actuator according to claim 1, wherein at least one semiconductor compound made of GaN, InN, AlN, $Al_xGa_{1-x}N$, $In_xGa_{1-x}N$ and $In_xAl_{1-x}N$ with a relative element content of x being at least 0 and at most 1.0.

28. The semiconductor actuator according to claim 1, wherein the first structure is disposed on a side orientated towards the substrate base and the second structure is disposed on a side orientated away from the substrate base, the first and second structures being disposed abutting against each other.

29. The semiconductor actuator according to claim 28, wherein at least one of (a) the second structure consists of one of $Al_xGa_{1-x}N$, and AlN and (b) the first structure consists of GaN.

30. The semiconductor actuator according to claim 28, wherein the second structure consists of $Al_xGa_{1-x}N$ with x being at least 0.1 and at most 0.3.

31. The semiconductor actuator according to claim 28, wherein the second structure consists of $Al_xGa_{1-x}N$ with x being at least 0.15 and at most 0.25.

32. The semiconductor actuator according to claim 29, wherein the second structure consists of AlN and the first structure consists of GaN and wherein an intermediate layer is disposed between the second and first structures.

33. The semiconductor actuator according to claim 32, wherein the intermediate layer one of comprises and consists of a semiconductor material.

34. The semiconductor actuator according to claim 33, wherein the intermediate layer is configured as a layer which comprises AlN and GaN, in which the AlN portion increases in a direction from the first structure towards the second structure.

35. The semiconductor actuator according to claim 29, wherein an expansion of the second structure in a direction substantially perpendicular to the surface thereof which is orientated towards the substrate base is in a range at least one of above 5nm and below 1000 nm.

36. The semiconductor actuator according to claim 35, wherein the range is at least one of above 10 nm and below 200 nm.

37. The semiconductor actuator according to claim 1, wherein the deflectable bending structure (1) comprises or consists of a layer, the layer with at least one of (a) a lack of impressed current and (b) a lack of applied voltage (inoperative position), is mechanically strained in one of tension and pressure and (2) has a stress compensation layer.

38. The semiconductor actuator according to claim 37, wherein the layer grows epitaxially.

39. The semiconductor actuator according to claim 1, wherein the side of the semiconductor heterostructure which is orientated away from the substrate base is configured as a mechanically strained layer.

40. The semiconductor actuator according to claim 37, wherein the straining is configured such that the bending structure is deflected out of the inoperative position one of (a) substantially away from the substrate base and (b) substantially towards the substrate base.

41. The semiconductor actuator according to claim 1, wherein the bending structure is at least one of (a) at least partially one of undoped, p-doped and n-doped and (b) has a correspondingly doped layer.

42. The semiconductor actuator according to claim 41, wherein at least one of (a) the dopant content is at least one of greater than 0 atoms per cm3 and less than 1020 atoms per cm3, (b) the dopant one of comprises and consists of at least one of silicon (Si) and magnesium (Mg), and (c) the doping is at least one of a volume doping and a pulse doping.

43. The semiconductor actuator according to claim 19, wherein the electrical contact and the bending structure are disposed such that the electrical contact is closed by deflecting the bending structure using the contact element.

44. The semiconductor actuator according to claim 43, wherein the electrical contact forms one of a waveguide strip and a contact strip.

45. The semiconductor actuator according to claim 19, wherein a conductive counter-element and the bending structure are at least one of disposed and configured such that, when deflecting the bending structure using one of a predefined impressed current and by a predefined impressed voltage, a spacing of the electrically conductive element relative to the counter-element has a predefined value.

46. The semiconductor actuator according to claim 1, wherein at least one of the electrical supply contacts is at least one of (a) configured as one of an alloyed ohmic contact, a metallic non-alloyed ohmic contact, an alloyed Schottky contact and a non-alloyed Schottky contact; (b) configured in the interior of the bending structure by implantation; and (c) one of a p contact and an n contact.

47. The semiconductor actuator according to claim 1, wherein the bending structure which is substantially perpendicular to the interface configured with the substrate base has a thickness of at least one of above 0.2 μm and below 50 μm.

48. The semiconductor actuator according to claim 1, wherein the bending structure which is substantially perpendicular to the interface configured with the substrate base, has a thickness of at least one of above 0.5 μm and below 5 μm.

49. The semiconductor actuator according to claim 1, wherein at least two of the supply contacts are connected to each other electrically via one of a current source and a voltage source.

50. The semiconductor actuator according to claim 1, wherein at least a partial portion of the deflectable cantilevered part of the bending structure is formed as a membrane such that, by at least one of (a) impressing a temporally variable current and (b) applying a temporally variable voltage to at least two of the supply contacts with the membrane substantially perpendicular to the membrane plane which pertains in the inoperative position, a temporally variable curving movement being implemented.

51. The semiconductor actuator according to claim 50, wherein the membrane has one of an essentially circular shape and an essentially semicircular shape.

52. The semiconductor actuator according to claim 1, wherein at least a partial portion of the surface of the bending structure is provided with an adsorbing coating.

53. A micromechanical device, comprising:
a semiconductor actuator including (a) a substrate base; (b) a bending structure connected to the substrate base and deflectable at least partially relative to the substrate base, the bending structure having semiconductor compounds on the basis of nitrides of main group III elements; and (c) at least two electrical supply contacts which one of (1) impressing an electrical current in and (2) applying an electrical voltage to the bending structure, at least two of the supply contacts being at least one of (i) disposed at a spacing from each other respectively on the bending structure and (ii) integrated in the latter,
wherein the device is one of a micromechanical varactor, a micromechanical variable coil element, a micromechanical electrical switching element and a micromechanical pump,
wherein the bending structure is securely connected in selected portions to the substrate base, the bending structure being cantilevered and deflectable in further selected portions relative to the substrate base,
wherein the bending structure has at least one of a homogeneous semiconductor layer and a semiconductor heterostructure, and
wherein at least one of (a) the homogeneous semiconductor structure one of comprises and consists of one of GaN, InN and AlN and (b) the semiconductor heterostructure has a first structure made of one of GaN, InN and AlN and a second structure made of one of $Al_xGa_{1-x}N$, $In_xGa_{1-x}N$ and $In_xAl_{1-x}N$.

* * * * *